(12) United States Patent
Yang et al.

(10) Patent No.: US 9,337,617 B2
(45) Date of Patent: May 10, 2016

(54) TUNABLE SEMICONDUCTOR LASERS

(71) Applicant: Board of Regents University of Oklahoma, Norman, OK (US)

(72) Inventors: Rui Q. Yang, Norman, OK (US); Zhaobing Tian, Albuquerque, NM (US); Lu Li, Norman, OK (US); Michael B. Santos, Norman, OK (US); Matthew B. Johnson, Norman, OK (US); Yuchao Jiang, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 0 days.

(21) Appl. No.: 14/630,358

(22) Filed: Feb. 24, 2015

(65) Prior Publication Data

US 2015/0244144 A1 Aug. 27, 2015

Related U.S. Application Data

(60) Provisional application No. 61/943,845, filed on Feb. 24, 2014.

(51) Int. Cl.
| | |
|---|---|
| *H01S 5/062* | (2006.01) |
| *H01S 5/30* | (2006.01) |
| *H01S 5/34* | (2006.01) |
| *H01S 5/06* | (2006.01) |
| *H01S 5/343* | (2006.01) |

(52) U.S. Cl.
CPC .............. *H01S 5/0622* (2013.01); *H01S 5/0614* (2013.01); *H01S 5/3013* (2013.01); *H01S 5/3422* (2013.01); *H01S 5/34306* (2013.01)

(58) Field of Classification Search
CPC . H01S 5/0622; H01S 5/0614; H01S 5/34306; H01S 5/3013

USPC .............. 372/20, 43.01, 44.01, 45.01
See application file for complete search history.

(56) References Cited

U.S. PATENT DOCUMENTS

| 5,502,787 A | 3/1996 | Capasso et al. |
| 5,588,015 A | 12/1996 | Yang |

(Continued)

OTHER PUBLICATIONS

Bewley, W., et al., "Ridge-width dependence of midinfrared interband cascade laser characteristics," Optical Engineering, vol. 49, No. 11, Nov. 2010, 5 pages.

(Continued)

*Primary Examiner* — Dung Nguyen
(74) *Attorney, Agent, or Firm* — Conley Rose, P.C.; Grant Rodolph; Jonathan K. Polk

(57) ABSTRACT

A tunable semiconductor laser having, in one embodiment, a higher bias voltage end, a lower bias voltage end, and an optically active gain region comprising a band-gap configured to emit light at an emission wavelength that is tunable when an electric field is generated across the optically active gain region by applying a bias voltage thereto, an electron quantum well (QW) layer positioned closer to the higher bias voltage end than the lower voltage bias end, and a hole QW layer positioned closer to the lower bias voltage end than the higher bias voltage end and comprising a type-II band alignment with the electron QW layer such that the band-gap is determined by an energy difference between a ground electron state in the electron QW layer and a ground hole state in the hole QW layer, wherein the emission wavelength is red-shifted upon an increase in a bias voltage applied to the optically active gain region.

24 Claims, 16 Drawing Sheets

(56) References Cited

U.S. PATENT DOCUMENTS

| | | | |
|---|---|---|---|
| 5,799,026 | A | 8/1998 | Meyer et al. |
| 6,301,282 | B1 | 10/2001 | Capasso et al. |
| 6,404,791 | B1 | 6/2002 | Yang |
| 7,282,777 | B1 | 10/2007 | Chuang et al. |
| 7,382,806 | B2 | 6/2008 | Tredicucci et al. |
| 8,125,706 | B2 | 2/2012 | Vurgaftman et al. |
| 2005/0173694 | A1* | 8/2005 | Mawst et al. ............. 257/14 |
| 2009/0162963 | A1* | 6/2009 | Tansu et al. ............. 438/47 |
| 2012/0044964 | A1 | 2/2012 | Yang et al. |
| 2013/0003770 | A1* | 1/2013 | Vurgaftman et al. ...... 372/45.01 |
| 2013/0182736 | A1* | 7/2013 | Hashimoto et al. ...... 372/45.012 |

OTHER PUBLICATIONS

Ohtani, K., et al., "An InAs-Based Intersubband Quantum Cascade Laser," The Japan Society of Applied Physics, vol. 41, Part 2 No. 11B, 2002, pp. L1279-L1280.

Tian, Z., et al., "InAs-Based Mid-Infrared Interband Cascade Lasers Near 5.3 μm," IEEE Journal of Quantum Electronics, vol. 48, No. 7, Jul. 2012, pp. 915-921.

Yang, R., et al., "Distributed Feedback Mid-IR Interband Cascade Lasers at Thermoelectric Cooler Temperatures," IEEE Journal of Selected Topics in Quantum Electronics, vol. 13, No. 5, Sep./Oct. 2007, pp. 1074-1078.

Teissier, R., et al., "InAs/AlSb quantum cascade lasers operating at 6.7 μm," Electronics Letters, vol. 39, No. 17, Aug. 21, 2003, pp. 1252-1254.

Tian, Z., "Plasmon-Waveguide Interband Cascade Lasers Near 7.5 μm," IEEE Photonics Technology Letters, vol. 21, No. 21, Nov. 1, 2009, pp. 1588-1590.

Tian, Z., et al., "InAs-based interband cascade lasers near 6 μm," Electronics Letters, vol. 45, No. 1, Jan. 1, 2009, pp. 48-49.

Suchalkin, S., et al., "Widely tunable type-II interband cascade laser," Applied Physics Letters 88, Jan. 17, 2006, 3 pages.

Yang, R., "Hybrid Semiconductor Laser Absent a Top Semiconductor Cladding Layer," U.S. Appl. No. 14/262,326, filed Apr. 25, 2014.

\* cited by examiner

FIG. 11

| ACTIVE QW DESIGN | WAFER | ACTIVE REGION THICKNESS IN Å InAs/GaInSb/InAs (/GaInSb/InAs) | NUMBER OF STAGES | $\lambda$ IN µm AT 80 K | DEVICE SIZE WIDTH µm | DEVICE SIZE LENGTH mm | T(K) | cw/PULSE | TUNING RANGE $cm^{-1}$ | TUNING RATE $cm^{-1}/(A/cm^2)$ | TUNING RATE $cm^{-1}/mA$ | MAXIMUM CURRENT mA |
|---|---|---|---|---|---|---|---|---|---|---|---|---|
| TWO InAs QW LAYERS | R066 | 24/29/21 | 12 | 4.43 | 14 | 1.0 | 80 | cw | 230 | -0.15 | -1.1 | 250 |
| TWO InAs QW LAYERS | R066 | 24/29/21 | 12 | 4.43 | 14 | 1.0 | 100 | cw | 280 | -0.17 | -1.2 | 260 |
| TWO InAs QW LAYERS | R084 | 22/29/21 | 12 | 4.35 | 14 | 2.0 | 100 | cw | 74 | -0.073 | -0.26 | 250 |
| TWO InAs QW LAYERS | R089 | 22/29/23 | 12 | 4.73 | 14 | 2.0 | 120 | PULSE | 90 | -0.020 | -0.071 | 1500 |
| TWO InAs QW LAYERS | R090 | 22/29/21/29 | 8 | 4.76 | 150 | 1.5 | 180 | cw | 150 | -1.1 | -0.50 | 500 |
| TWO InAs QW LAYERS | R090 | 22/29/21/29 | 8 | 4.76 | 150 | 0.75 | 160 | cw | 47 | -0.13 | -0.11 | 500 |
| THREE InAs QW LAYERS | R064 | 28/33/25/36/21 | 15 | 6.67 | 150 | 0.75 | 80 | cw | 51 | -0.13 | -0.12 | 500 |
| THREE InAs QW LAYERS | R064 | 28/33/25/36/21 | 15 | 6.67 | 15 | 1.8 | 80 | cw | 180 | -0.13 | -0.49 | 360 |
| THREE InAs QW LAYERS | R064 | 28/33/25/36/21 | 15 | 6.67 | 40 | 1.8 | 80 | PULSE | 100 | -0.16 | -0.22 | 500 |
| THREE InAs QW LAYERS | R064 | 28/33/25/36/21 | 15 | 6.67 | 40 | 1.8 | 80 | cw | 85 | -0.10 | -0.14 | 500 |
| THREE InAs QW LAYERS | R064 | 28/33/25/36/21 | 15 | 6.67 | 20 | 3.0 | 80 | PULSE | 130 | -0.20 | -0.34 | 400 |
| THREE InAs QW LAYERS | R094 | 28/33/25/36/21 | 15 | 6.89 | 20 | 3.0 | 80 | PULSE | 99 | -0.13 | -0.22 | 450 | ural Science Foundation (NSF) grant ECCS-1002202.
TUNABLE SEMICONDUCTOR LASERS

CROSS-REFERENCE TO RELATED APPLICATIONS

This application claims priority to U.S. provisional patent application No. 61/943,845 filed Feb. 24, 2014 by Rui Q. Yang, et al., and titled "Tunable Semiconductor Lasers," which is incorporated by reference in its entirety.

STATEMENT REGARDING FEDERALLY SPONSORED RESEARCH OR DEVELOPMENT

This invention was made with government support from National Science Foundation (NSF) grant ECCS-1002202. The government has certain rights in the invention.

REFERENCE TO A MICROFICHE APPENDIX

Not applicable.

BACKGROUND

Semiconductor mid-infrared (mid-IR) lasers with a wide tuning range are desirable for many applications such as spectroscopy and biochemical analysis. Tunable quantum cascade (QC) lasers have been demonstrated in several approaches, including single-mode distributed feedback (DFB) lasers, multi-section lasers, heterogeneous active regions, and external cavities (ECs). Each approach has shortcomings. For example, DFB lasers can produce single-mode emission, but have a very limited current-controlled tuning range of approximately 10 inverse centimeters ($cm^{-1}$). Multi-section lasers, such as two-section lasers with parallel and independent current injection for each section through multiple contacts, can have a large tuning range, but have higher threshold currents and require extra device fabrication steps. EC lasers lack long-term mechanical and vibrational stability and require well-aligned external optics components. A semiconductor laser tunable over a wide range in the mid-IR wavelengths, which provides easier fabrication and simpler components, is desirable.

BRIEF DESCRIPTION OF THE DRAWINGS

Several embodiments of the presently disclosed inventive concepts are hereby illustrated in the appended drawings. It is to be noted however, that the appended drawings only illustrate several typical embodiments and are therefore not intended to be considered limiting of the scope of the presently disclosed inventive concepts. Further, in the appended drawings, like or identical reference numerals may be used to identify common or similar elements and not all such elements may be so numbered. The figures are not necessarily to scale and certain features and certain views of the figures may be shown as exaggerated in scale or in schematic in the interest of clarity and conciseness.

FIG. 11 shows electron QW layer thicknesses, tuning rates, and tuning ranges of various laser structures.

DETAILED DESCRIPTION

Figure 1:
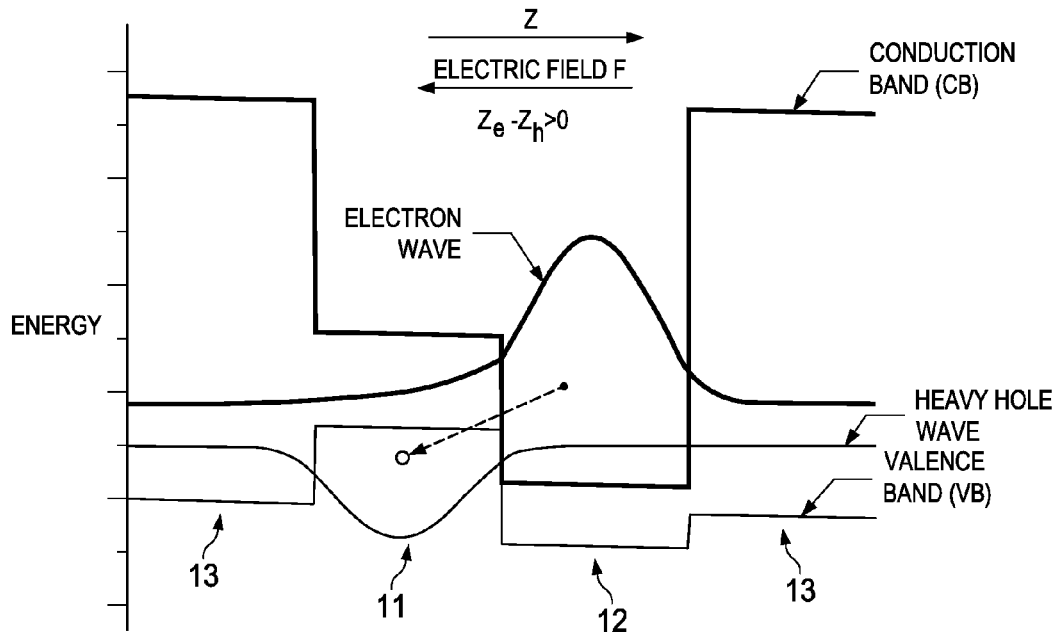
FIG. 1 is a schematic illustration of a typical type II heterostructure formed by an electron quantum well (QW) layer and a hole QW layer. The dashed arrow illustrates the transition between the centroids of the electron (filled circle) and hole (empty circle) probability distributions.

In at least one embodiment, the presently disclosed inventive concepts are directed to a tunable semiconductor laser comprising a higher bias voltage end, a lower bias voltage end, and an optically active gain region comprising a band-gap configured to emit light at an emission wavelength that is tunable when an electric field is generated across the optically active gain region by applying a bias voltage thereto, an electron quantum well (QW) layer positioned closer to the higher bias voltage end than the lower voltage bias end, and a hole QW layer positioned closer to the lower bias voltage end than the higher bias voltage end and comprising a type-II band alignment with the electron QW layer such that the band-gap is determined by an energy difference between a ground electron state in the electron QW layer and a ground hole state in the hole QW layer, wherein the emission wavelength is redshifted upon an increase in a bias voltage applied to the optically active gain region.

Before describing further embodiments of the presently disclosed and claimed inventive concepts in detail by way of exemplary description, drawings, experimentation, and results, it is to be understood that the inventive concepts are not limited in its application to the details of construction and the arrangement of the compositions, steps, or components set forth in the following description or illustrated in the drawings, examples, experiments, and/or results. The presently disclosed inventive concepts are capable of other embodiments or of being practiced or carried out in various ways. As such, the language used herein is intended to be given the broadest possible scope and meaning; and the embodiments are meant to be exemplary, not exhaustive. Also, it is to be understood that the phraseology and terminology employed herein is for the purpose of description and should not be regarded as limiting except where indicated as such.

Unless otherwise defined herein, scientific and technical terms used in connection with the presently disclosed inventive concepts shall have the meanings that are commonly understood by those of ordinary skill in the art. Further, unless otherwise required by context, singular terms shall include pluralities and plural terms shall include the singular. The nomenclatures utilized in connection with, and the laboratory procedures and techniques of, analytical chemistry, and semiconductor production described herein are those well-known and commonly used in the art.

All patents, published patent applications, and non-patent publications mentioned in the specification are indicative of the level of skill of those skilled in the art to which this presently disclosed and claimed inventive concepts pertains. All patents, published patent applications, and non-patent publications referenced in any portion of this application are herein expressly incorporated by reference in their entirety to the same extent as if each individual patent or publication was specifically and individually indicated to be incorporated by reference.

As utilized in accordance with the present disclosure, the following terms, unless otherwise indicated, shall be understood to have the following meanings: The use of the word "a" or "an," or of the phrase "at least a first," when used in the claims and/or the specification may mean "one," "one or more," "at least one," or "one or more than one." For example, in the claims and/or specification, reference to a laser comprising "at least a first electron quantum well layer" means that the laser may comprise only one electron quantum well layer or only one hole quantum well layer in certain embodiments or may comprise more than one electron quantum well layer or more than one hole quantum well layer in other embodiments. The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation or error for the device, the method being employed to determine the value, or the variation that exists among the study subjects. For example but not by way of limitation, when the term "about" is utilized, the designated value may vary by plus or minus fifteen percent, plus or minus twelve percent, or plus or minus eleven percent, or plus or minus ten percent, or plus or minus nine percent, or plus or minus eight percent, or plus or minus seven percent, or plus or minus six percent, or plus or minus five percent, or plus or minus four percent, or plus or minus three percent, or plus or minus two percent, or plus or minus one percent, or plus or minus one-half percent.

The use of the term "at least one" will be understood to include one as well as any quantity more than one, including but not limited to, 2, 3, 4, 5, 6, 7, 8, 9, 10, 11, 12, 13, 14, 15, 16, 17, 18, 19, 20, 21, 22, 23, 24, 25, 30, 35, 40, 45, 50, 55, 60, 65, 70, 75, 80, 85, 90, 95, 100, or more. The term "at least one" may extend up to 500 or 1000 or more, depending on the term to which it is attached; in addition, the quantities of $500/1000$ are not to be considered limiting, as higher limits may also produce satisfactory results. In addition, the use of the term "at least one of X, Y and Z" will be understood to include X alone, Y alone, and Z alone, as well as any combination of X, Y and Z. The use of ordinal number terminology (i.e., "first", "second", "third", "fourth", etc.) is solely for the purpose of differentiating between two or more items and is not meant to imply any sequence or order or importance to one item over another or any order of addition, for example.

As used in this specification and claims, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

As used herein, the term "substantially" means that the subsequently described event or circumstance completely occurs or that the subsequently described event or circumstance occurs to a great extent or degree. For example, the term "substantially" means that the subsequently described event or circumstance occurs at least 90% of the time, or at least 95% of the time, or at least 98% of the time. In general, the term "substantially" will be understood to allow for minor variations and/or deviations that do not result in a significant impact thereto.

As used herein, "continuous wave" means the operation of the laser occurs continuously (when electrical current injection occurs via direct current (DC)) and "pulsed mode" means electrical current injection in the laser occurs under a series of pulses of electrical current (regular or irregular).

Further, in this detailed description and the appended claims, each numerical value should be read once as modified by the term "about" (unless already expressly so modified), and then read again as not so modified unless otherwise indicated in context. Also, any range listed or described herein is intended to include, implicitly or explicitly, any number within the range, particularly all integers, including the end points, and is to be considered as having been so stated. For example, "a range from 1 to 10" is to be read as indicating each possible number, particularly integers, along the continuum between about 1 and about 10. Thus, even if specific data points within the range, or even no data points within the range, are explicitly identified or specifically referred to, it is to be understood that any data points within the range are to be considered to have been specified, and that the inventors possessed knowledge of the entire range and the points within the range.

The presently disclosed inventive concepts, having now been generally described, will be more readily understood by reference to the following examples and embodiments, which are included merely for purposes of illustration of certain aspects and embodiments of the presently disclosed inventive concepts, and are not intended to limit the presently disclosed inventive concepts. Without further elaboration, it is believed that one skilled in the art can, using the present description, practice the presently disclosed inventive concepts to the fullest extent. The following examples and methods describe how to make and use the various aspects of the presently disclosed inventive concepts and are to be construed, as noted above, only as illustrative, and not limitations of the disclosure in any way whatsoever. Those skilled in the art will promptly recognize appropriate variations from the embodiments described herein.

IC lasers exhibit certain differences when compared to QC lasers. First, the gain width of an interband transition is inherently much broader than that of an intersubband transition. Second, the transition energy (or the band-gap) of an IC laser decreases with rising temperature and has a larger temperature coefficient than that of the intersubband transition energy of a QC laser. In the presently disclosed lasers, such a feature can be used for more effectively tuning the lasing wavelength in an IC laser. In addition, the spatially indirect transition in the type-II quantum well (QW) active region allows a large nonzero dipole similar to a diagonal transition in a QC laser. Consequently, a strong first-order Stark effect can be used to tune the emission wavelength by an electric field. Thus, in the present disclosure, these properties have been used collectively to construct a laser, such as an IC laser having a wide mid-IR tuning range with a redshift (i.e., the emission wavelength increases with increasing current or bias voltage), which operates at higher temperatures. The presently disclosed tunable semiconductor lasers provide a monolithic laser architecture with a wide tuning range via electric current injection and can be constructed without extra fabrication complications or additional external parts.

In at least one embodiment, the presently disclosed inventive concepts include a tunable semiconductor laser (e.g., an IC laser) comprising an active gain region with type-II heterostructure. An electric field is generated across the active gain region by applying a bias voltage. The active gain region includes at least one electron quantum well layer and at least one hole quantum well layer with type-II band alignment so that the band-gap of the active gain region is the energy difference between the ground electron state in the electron quantum well layer and the ground hole state in the hole quantum well layer. In the active gain region, the electron quantum well layer and the hole quantum well layer are positioned and configured for enabling the emission wavelength to be redshifted when the bias voltage is increased. In at least one embodiment, the laser is an interband laser incorporating an active gain region that is able to generate a large redshift tuning range of over 100 cm$^{-1}$ at wavelengths in a range of from about 2.3 micrometers (μm) to about 12 μm.

As noted above, the presently disclosed inventive concepts are directed to semiconductor lasers or amplifiers, including but not limited to IC lasers, whose emission wavelengths can be tuned by changing the bias voltage. The term "electrical tuning" refers to a wavelength shift that is achieved by changing the electric field with an external bias voltage on the laser.

Specific embodiments of the presently disclosed inventive concepts are described herein for the purpose of illustration, and the inventive concepts are not intended to be limited thereto. In one embodiment, the lasers of the presently disclosed inventive concepts differ from previous IC laser structures based on III-V compound semiconductors, which have the electron wave-function of the ground state in the active region centered on the left-side QW layer that is closer to the lower voltage side. In such prior lasers, a blueshift of lasing wavelengths was observed wherein the heating and Stark effects shift the wavelengths in opposite directions. The wide wavelength tuning of the lasers of the presently disclosed inventive concepts is achieved by making the Stark effect wavelength shift occur in the same direction (not opposite) as the heating effect wavelength shift due to the current injection. As such, both effects provide positive feedback to each other to enhance the lasing redshift with electrical current. Furthermore, by comparing the 3-QW layer active gain region and 2-QW layer active gain region designs, it is demonstrated how a strong electrical tuning with a large range can be achieved in both CW and pulsed modes through adjusting the electron wave function and the interband dipole.

FIG. 1 shows one embodiment of an active gain region of a laser of the presently disclosed inventive concepts. The wave function modulus profiles for the ground state of the electron QW layer and heavy hole QW layer in the active gain region with an electric field that is generated under a bias voltage are indicated. In this non-limiting embodiment, the active gain region forms a type II heterostructure comprising one electron QW layer 12 and one hole QW layer 11, where electrons and holes are mainly located in the different layers. The band-gap of the type II active gain region ($E_g$) is the energy difference between the electron ground state in the electron QW layer and hole ground state in the hole QW layer ($E_e$-$E_h$), which determines the emitted photon energy (hν) and thus the lasing wavelength λ. In operation, a forward bias voltage (the right-hand side is at the higher voltage) is applied to the device, resulting in an electric field (F) along a direction from right to left in FIG. 1. Consequently, the band-gap ($E_g$) typically will change with the electric field (F) according to the Stark effect. The Stark shift, the energy change of such an interband transition (ΔE) in type-II QWs, can be written as $$\Delta E = -q|\Delta F|(z_e - z_h), \quad (1)$$

where q is the electron charge, ΔF is an increment increase of the electric field (F) across the active gain region, and ($z_e$-$z_h$) is the distance between the centroids of the electron and hole probability distributions. The minus sign is because the electric field is in the opposite direction of z.

However, the Stark effect alone would not usually lead to lasing wavelength tuning. This is because, in an ideal semiconductor laser, carrier concentration is pinned at the threshold and thus the lasing wavelength typically will not shift with further increase of injection current above a threshold. Therefore, even if the electroluminescent emission can be tuned largely by the Stark effect in light emitting devices, additional mechanisms may be required to achieve significant wavelength tuning for semiconductor lasers. On the other hand, real semiconductor lasers are not ideal and their carrier concentrations may not necessarily be pinned at the threshold. In the presently disclosed inventive concepts, a heating effect has been combined with the Stark effect to significantly enhance the electrical tuning, as described in more detail below.

Further, in regard to FIG. 1, in certain non-limiting exemplary embodiments of the active gain regions of the semiconductor lasers of the presently disclosed inventive concepts such as represented in FIG. 1, the hole QW layer 11 may have a thickness that is in a range of from about 23 angstroms (Å) (2.3 nanometer (nm)) to about 35 Å (3.5 nm), and the electron QW layer 12 may have a thickness that is in a range of from about 15 Å (1.5 nm) to about 40 Å (4 nm). The layers 13/11/12/13 may comprise, in one non-limiting example, aluminum antimonide (AlSb)/gallium indium antimonide ($Ga_{1-x}In_xSb$)/ indium arsenide (InAs)/AlSb, respectively. In a non-limiting embodiment, x in $Ga_{1-x}In_xSb$ may be in a range of from about 0.2 to about 0.4, for example.

Figure 2:
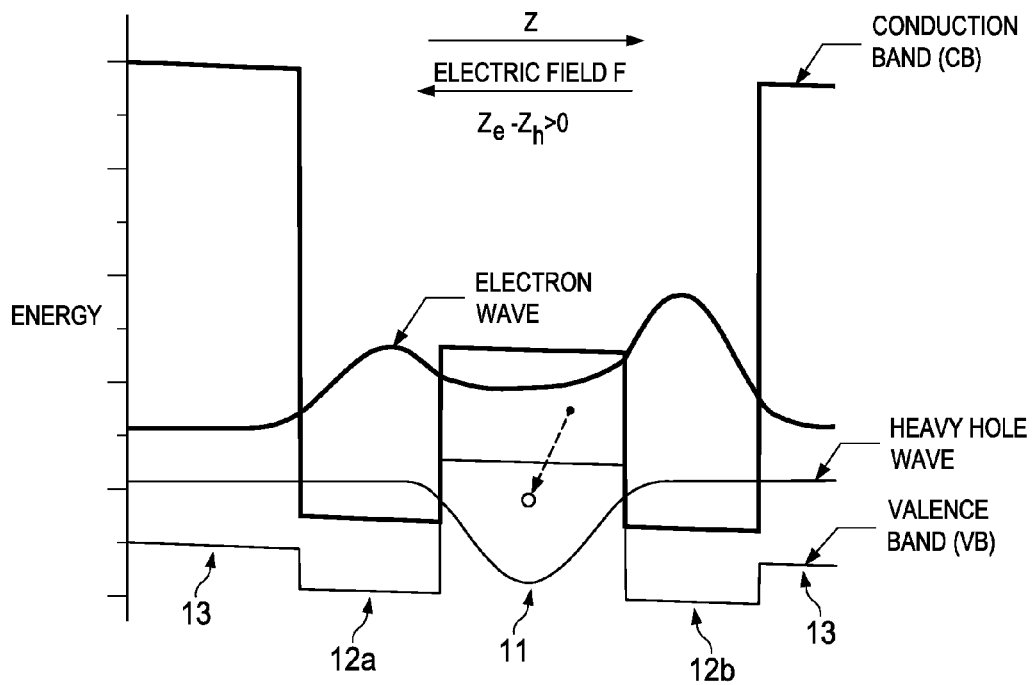
FIG. 2 schematically illustrates the band profiles and wave function modulus distribution in a W active region having a hole QW layer sandwiched by two electron QW layers, wherein the left-hand electron QW layer is thicker than the right-hand QW layer.

An active gain region as shown in FIG. 1 has a positive interband dipole $(z_e-z_h)$, which results in the increase (redshift) of emission wavelength with increasing electric field according to equation 1. To get a larger wave function overlap, a W-like structure is usually implemented in a type-II QW active gain region as represented in FIG. 2. The W-like structure has one hole QW layer 11 sandwiched by a left-side electron QW layer 12a and a right-side electron QW layer 12b surrounded by barrier layers 13 that are made of wide band-gap semiconductor materials. In one embodiment of the presently disclosed inventive concepts, the relative thickness of hole QW layer 11 between electron QW layers 12a and 12b is configured to have a positive interband dipole under a forward bias voltage. In the non-limiting exemplary embodiment of FIG. 2, the left-side electron QW layer 12a of the active gain region may have a thickness that is about 4% to about 10% greater than a thickness of the right-side electron QW layer 12b. A positive interband dipole $(z_e-z_h)$ is obtained in this configuration with an electric field, resulting in a redshift of emission wavelength with increasing electric field. The redshift tuning is very beneficial because heat-induced temperature tuning is also redshift for III-V compound semiconductor materials, for example.

Figure 3:
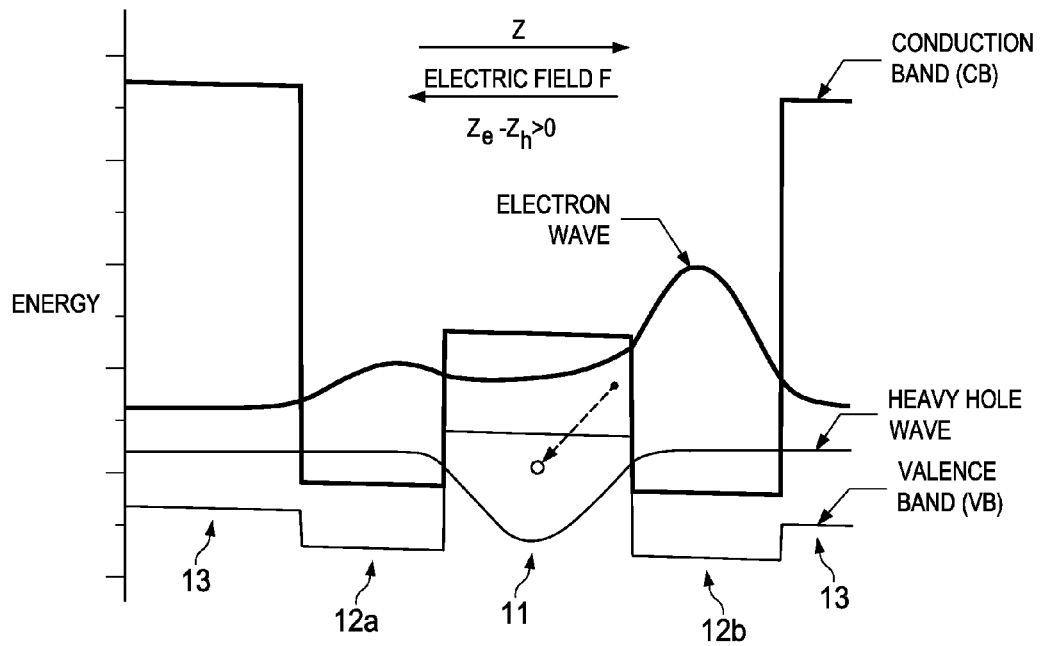
FIG. 3 schematically illustrates the band profiles and wave function modulus distribution in the W active region having a hole QW layer sandwiched by two electron QW layers, wherein the right-hand electron QW layer is thicker than the left-hand QW layer.

FIG. 3 shows a non-limiting exemplary embodiment of an active gain region similar to that of FIG. 2 except that the thickness of left-side electron QW layer 12a is less than the thickness of right-side electron QW layer 12b, for example from about 1% to about 10% less. A larger positive interband dipole $(z_e-z_h)$ is obtained in this configuration, thereby enhancing the Stark effect. In certain non-limiting exemplary embodiments of the active gain regions of the semiconductor lasers of the presently disclosed inventive concepts such as represented in FIGS. 2-3, hole QW layer 11 may have a thickness that is in a range of from about 25 Å (2.5 nm) to about 35 Å (3.5 nm), the right-side electron QW layer 12b may have a thickness that is in a range of from about 15 Å (1.5 nm) to about 50 Å (5 nm), and the left-side electron QW layer 12a may have a thickness that is in a range of from about 60% to about 110% of the thickness of the right-side electron QW layer 12b.

As shown from FIGS. 2-3, the electron distributions in the electron QW layers may be manipulated by adjusting the relative thicknesses of those electron QW layers. The electron distribution may further be manipulated by adjusting the electric field with the applied voltage across the laser structure. Generally, an active region with an electron distribution mainly located in a left-side electron QW layer or without a right-side electron QW layer results in a blueshift of emission wavelength with the applied bias voltage. However, as demonstrated herein, a large electric field can switch the electron distribution from the left-side electron QW layer to the right-side electron QW layer. This is illustrated in FIG. 2, where the electron wave function is distributed more in the right electron QW layer as the electric field increases, while the heavy-hole wave function is almost unchanged. Once the centroid of the electron wave function is on the right side of the hole wave function, the value of $(z_e-z_h)$ becomes positive and the interband transition energy will decrease with a further increase of the forward bias voltage. Hence, the sign of the interband dipole $(z_e-z_h)$ determines the emission wavelength's shifting direction (redshift for positive sign and blueshift for negative sign), while the magnitude of $(z_e-z_h)$ determines the wavelength tuning rate and range as shown in equation 1.

In certain non-limiting exemplary embodiments of the active gain regions of the semiconductor lasers of the presently disclosed inventive concepts such as represented in FIGS. 2-3, the layers 13/12a/11/12b/13 may comprise AlSb/InAs/$Ga_{1-x}In_xSb$/InAs/AlSb, respectively. In a non-limiting embodiment, x of $Ga_{1-x}In_xSb$ may be in a range of from about 0.2 to about 0.4, for example. In certain non-limiting exemplary embodiments of the semiconductor lasers of the presently disclosed inventive concepts, the $Ga_{1-x}In_xSb$ layer 11 may have a thickness that is in a range of from about 25 Å (2.5 nm) to about 35 Å (3.5 nm). The right-side InAs layer 12b may have a thickness that is in a range of from about 15 Å (1.5 nm) to about 50 Å (5 nm), and the left-side InAs layer 12a may have a thickness that is in a range of from about 60% to about 110% of the thickness of the right-side InAs layer 12b.

Figure 4:
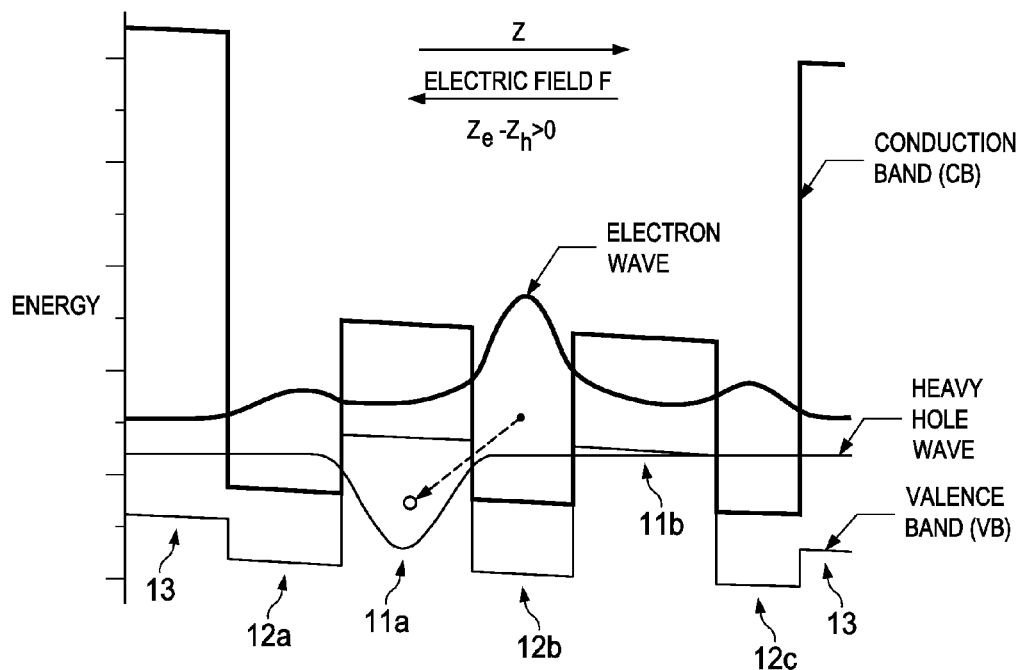
FIG. 4 schematically illustrates the band profiles and wavefunction modulus in an active region with two hole QW layers and three electron QW layers.

Other non-limiting exemplary embodiments of the semiconductor lasers of the presently disclosed inventive concepts have one or more active gain regions which comprise, as shown in FIG. 4, two hole QW layers 11a and 11b that alternate with three electron QW layers 12a, 12b and 12c and are flanked by barrier layers 13 made of wide band-gap semiconductor materials. This non-limiting exemplary configuration has an extra pair of electron and hole QW layers, which make a larger interband dipole as compared to that in the active gain regions in FIGS. 2-3. Additionally, this configuration can reduce the wave function overlap between the ground electron and ground hole states, effectively slowing down the lasing transition and thus helping to unclamp the pinning of the carrier concentration.

In certain non-limiting exemplary embodiments of the active gain regions of the semiconductor lasers of the presently disclosed inventive concepts such as represented in FIG. 4, at least one active region comprises layers 13/12a/11a/12b/11b/12c/13, wherein layers 13 are barrier layers, layer 12a is left-most electron QW layer 12a, layer 11a is left-side hole QW layer 11a, layer 12b is center electron QW layer 12b, layer 11b is right-side hole QW layer 11b, and layer 12c is right-most electron QW layer 12c. In certain non-limiting exemplary embodiments of the semiconductor lasers of the presently disclosed inventive concepts, the right-side hole QW layer 11b may have a thickness that is in a range of from about 20 Å (2 nm) to about 40 Å (4 nm), and the left-side hole QW layer 11a may have a thickness that is in a range of from about 80% to about 115% of the thickness of the right-side hole QW layer 11b. The right-most electron QW layer 12c may have a thickness that is in a range of from about 12 Å (1.2 nm) to about 35 Å (3.5 nm), the center electron QW layer 12b may have a thickness that is in a range of from about 10% to about 20% greater than the thickness of the electron QW layer 12c to the right, and the left-most electron QW layer 12a may have a thickness that is in a range of from about 10% to about 20% greater than the thickness of the center electron QW layer 12b to the right thereof.

In certain non-limiting exemplary embodiments of the active gain regions of the semiconductor lasers of the presently disclosed inventive concepts such as represented in FIG. 4, the layers 13/12a/11a/12b/11b/12c/13 may comprise AlSb/InAs/$Ga_{1-x}In_xSb$/InAs/$Ga_{1-x}In_xSb$/InAs/AlSb, respectively. In a non-limiting exemplary embodiment, x of $Ga_{1-x}In_xSb$ may be in a range of from about 0.2 to about 0.4, for example. In certain non-limiting exemplary embodiments of the semiconductor lasers of the presently disclosed inventive concepts, the right-side hole QW layer 11b may have a thickness that is in a range of from about 20 Å (2 nm) to about 40 Å (4 nm), and the left-side hole QW layer 11a may have a thickness that is in a range of from about 80% to about 115% of the thickness of the right-side hole QW layer 11b. The right-most electron QW layer 12c may have a thickness that is in a range of from about 12 Å (1.2 nm) to about 35 Å (3.5 nm), the center electron QW layer 12b may have a thickness that is in a range of from about 10% to about 20% greater than the thickness of the right-most electron QW layer 12c to the right thereof, and the left-most electron QW layer 12a may have a thickness that is in a range of from about 10% to about 20% greater than the thickness of the center electron QW layer 12b to the right thereof.

In certain non-limiting exemplary embodiments of the presently disclosed inventive concepts, the tunable semiconductor laser can have two or more of the active gain regions described above, wherein the plurality of the active gain regions are separated by injection regions and stacked in series to form an interband cascade laser. The laser can be grown on, for example, but not limited to, a gallium antimonide (GaSb), InAs, gallium arsenide (GaAs), indium phosphide (InP), or silicon (Si) substrate material, or any other substrate material which functions in accordance with the presently disclosed inventive concepts. The active and injection regions may comprise semiconductor layers selected from, but not limited to, the group consisting of InAs, indium arsenide antimonide (InAsSb), indium gallium arsenide (InGaAs), indium gallium arsenide antimonide (InGaAsSb), GaSb, GaInSb, aluminum gallium antimonide (AlGaSb), aluminum gallium indium antimonide (AlGaInSb), GaAs, AlSb, aluminum arsenide (AlAs), aluminum indium antimonide (AlInSb), aluminum antimonide arsenide (AlSbAs), aluminum gallium antimonide arsenide (AlGaSbAs), and aluminum indium gallium antimonide arsenide (AlInGaSbAs).

Figure 5:
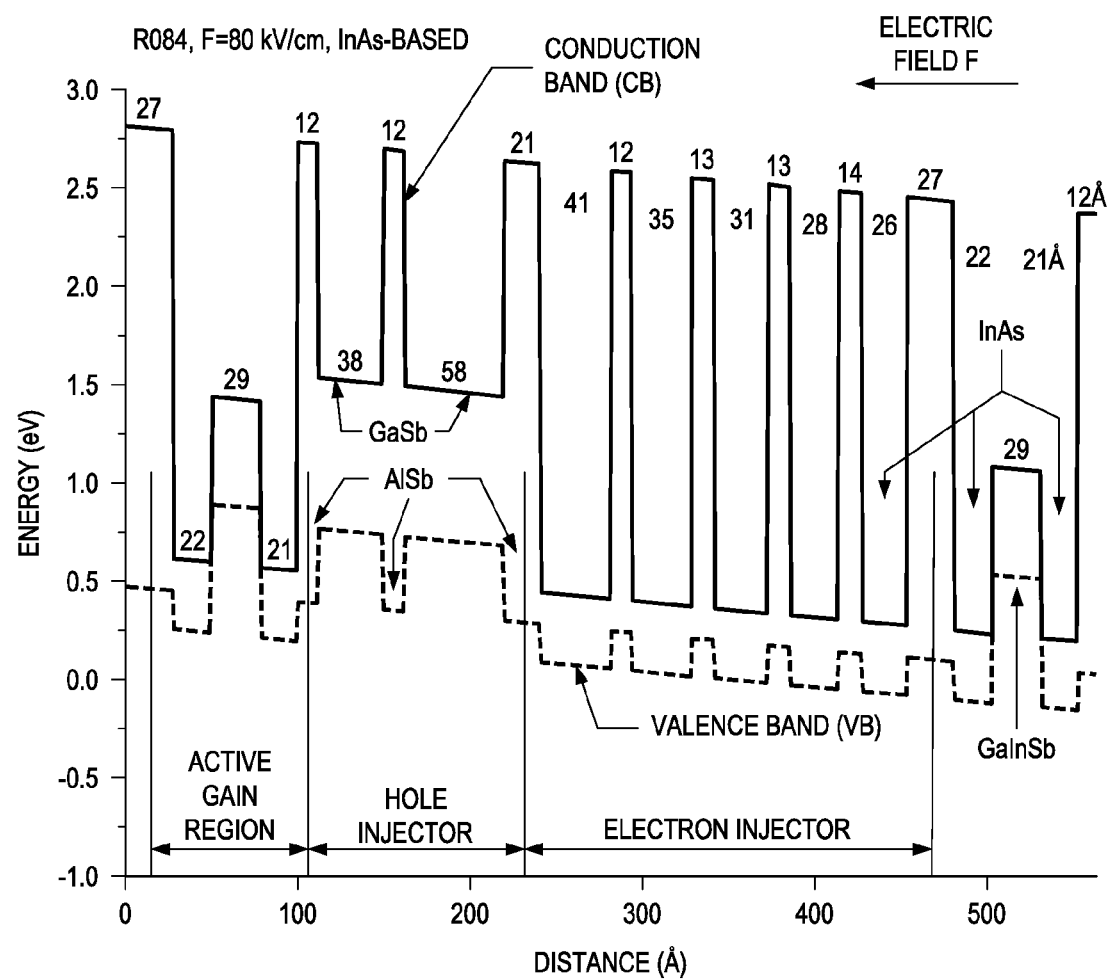
FIG. 5 schematically illustrates the conduction and valence band profiles of a tunable interband cascade (IC) laser with two electron QW layers in the active region.

One example of a non-limiting exemplary embodiment of an IC laser comprising two or more active gain regions which each comprise two electron QW layers is shown in FIG. 5. The thicknesses of the InAs/Ga$_{0.7}$In$_{0.3}$Sb/InAs QWs layers in the active gain regions are 22 Å/29 Å/21 Å, respectively. The active gain regions are separated by the injection regions. Each injection region comprises a hole injector made of, for example, GaSb/AlSb QW layers and the electron injector made of, for example, InAs/AlSb QW layers. Non-limiting exemplary thicknesses in Å are indicated above the corresponding layers.

Figure 6:
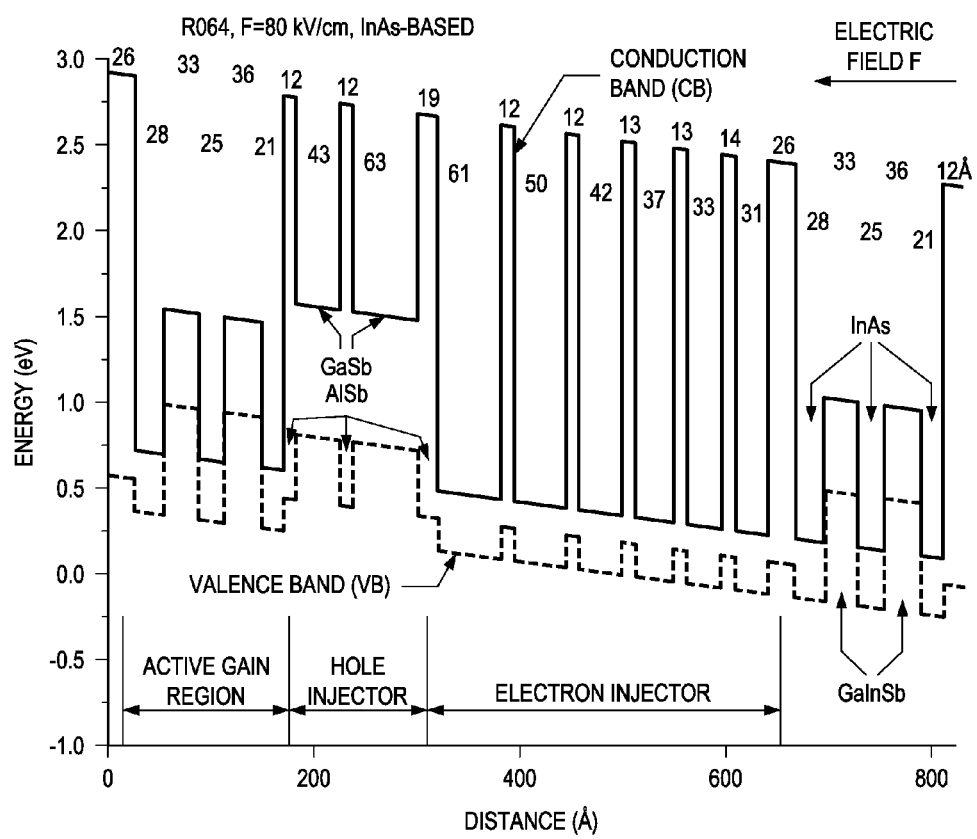
FIG. 6 schematically illustrates the conduction and valence band profiles of a tunable IC laser with three electron QW layers in the active region.

Another non-limiting exemplary embodiment of an IC laser constructed in accordance with the presently disclosed inventive concepts is shown in FIG. 6. The laser comprises an active gain region having three electron QW layers and two hole QW layers (such as in FIG. 4). The thicknesses of the layers are 28 Å/33 Å/25 Å/36 Å/21 Å, and in one embodiment comprise InAs/Ga$_{0.7}$In$_{0.3}$Sb/InAs/Ga$_{0.7}$In$_{0.3}$Sb/InAs QW layers, respectively. The active gain regions are separated by the injection regions. In one exemplary non-limiting embodiment, each injection region comprises a hole injector made of GaSb/AlSb QW layers and an electron injector made of InAs/AlSb QW layers. Non-limiting exemplary layer thicknesses in Å are indicated above the corresponding layers.

Figure 7A:
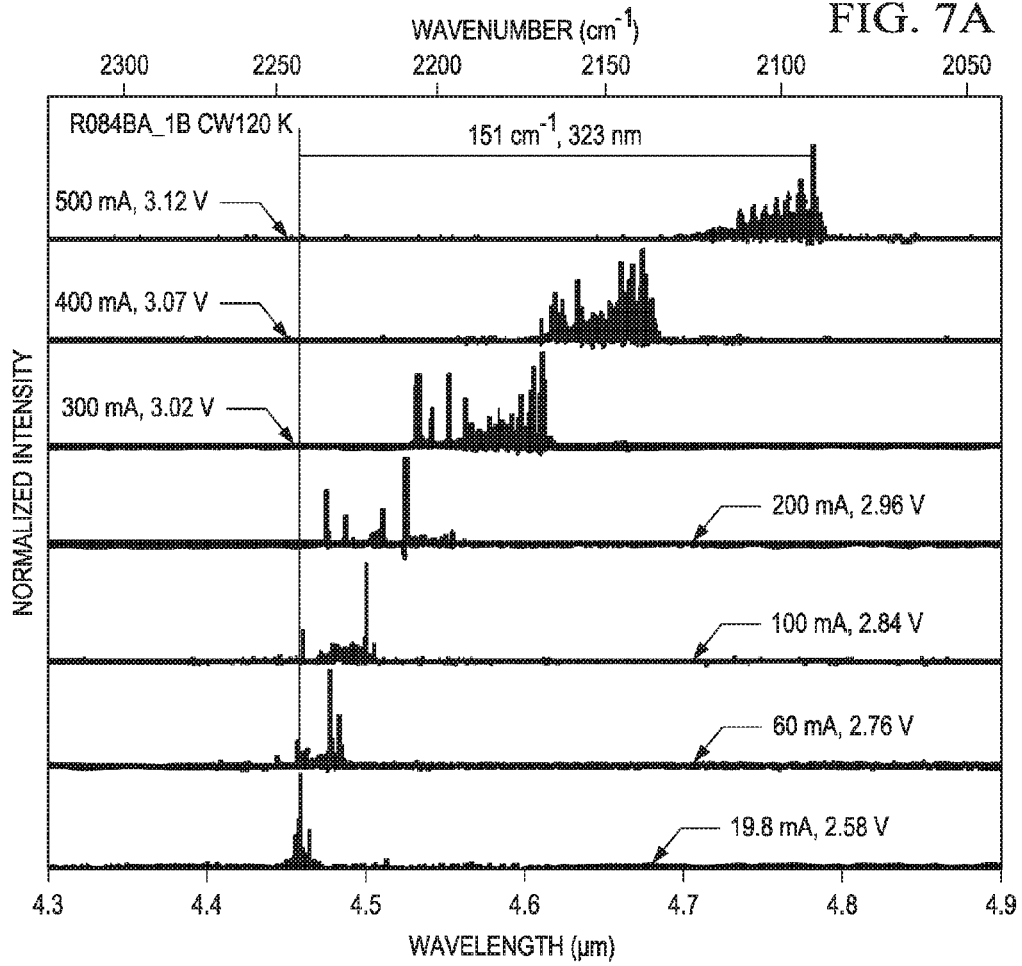
FIGS. 7A and 7B show the spectra characteristics and voltage-current curves of an exemplary laser made from the IC laser structure shown in FIG. 5.
Figure 7B:
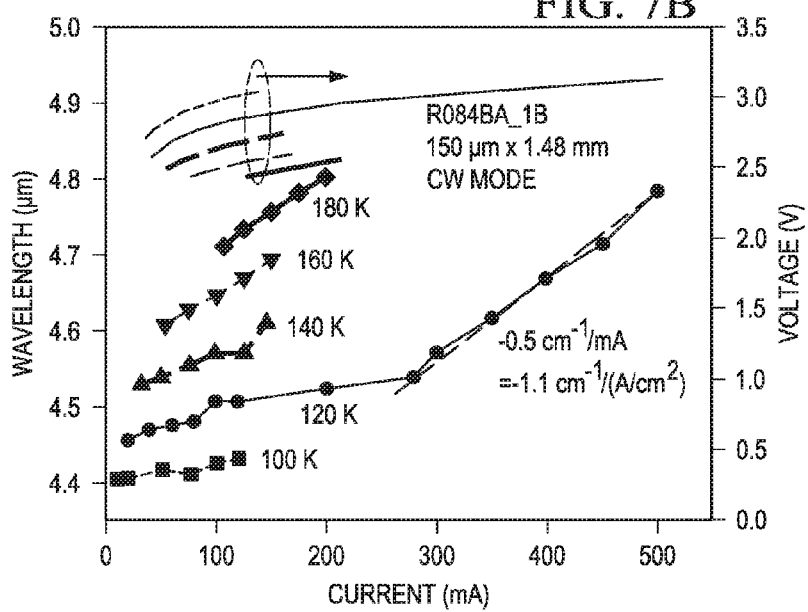

The emission spectra of a laser (made from the laser structure R084 as shown in FIG. 5 and grown by molecular beam epitaxy on an InAs substrate) and how its lasing wavelength and operating voltage changed at different temperatures are presented in FIGS. 7A-7B. In one non-limiting exemplary embodiment, a tuning range of 151 cm$^{-1}$ in wavenumber (or 323 nm in wavelength) was obtained in CW operation at 120 Kelvin (K).

Figure 8:
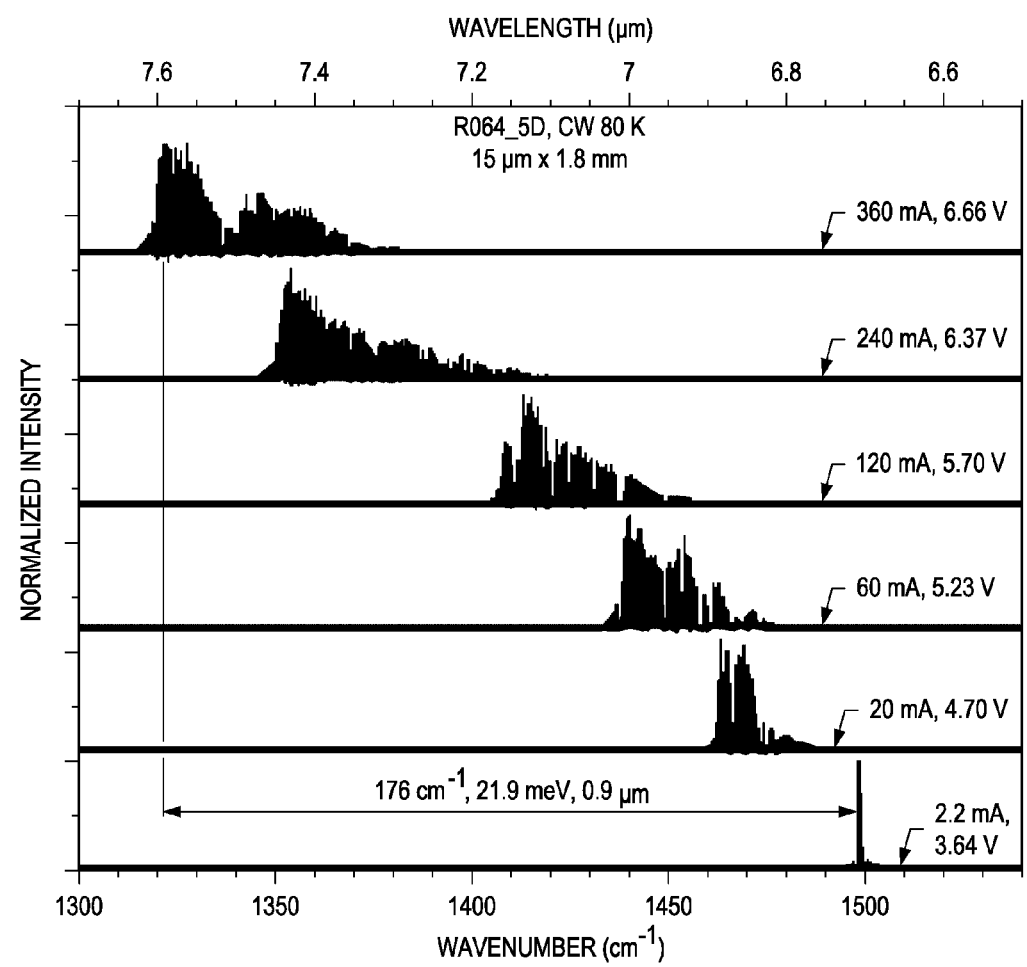
FIG. 8 shows the spectra characteristics of an exemplary laser with three electron QW layers in the active region corresponding to the structure shown in FIG. 6.

The emission spectra of another non-limiting exemplary laser (made from the laser structure R064 as shown in FIG. 6 and grown by molecular beam epitaxy on an InAs substrate) are shown in FIG. 8. A tuning range of 176 cm$^{-1}$ in wavenumber (or 900 nm in wavelength) was obtained in CW operation at 80 K.

Figure 9:
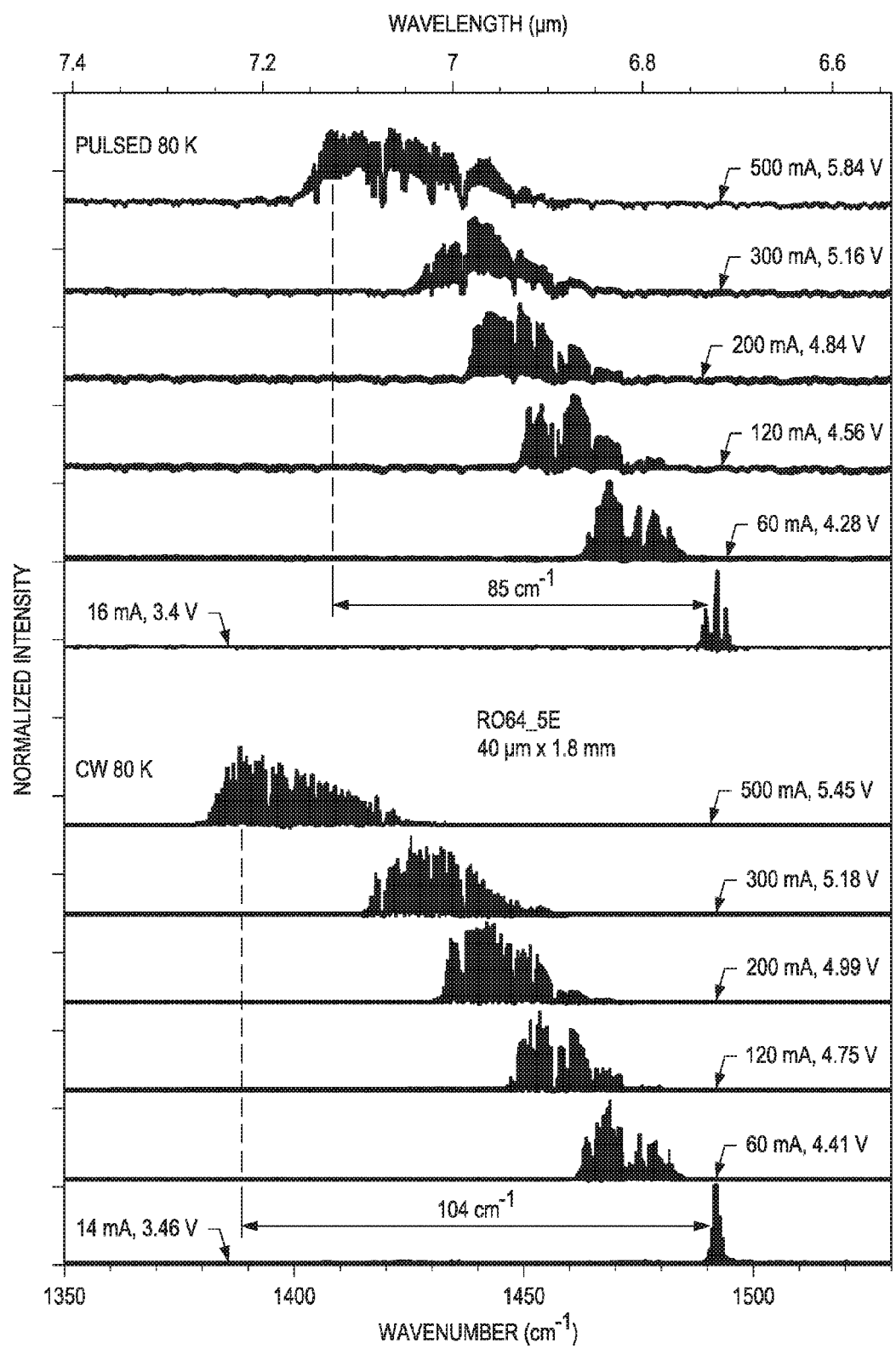
FIG. 9 shows the spectra characteristics of another exemplary laser under both continuous wave (CW) and pulsed operation. This laser has three electron QW layers in the active region, corresponding to the configuration shown in FIG. 6.

To examine the contribution of the heating effect, the lasing spectra of a 40 μm-wide ridge device fabricated from the wafer R064 were measured at 80 K in CW and pulsed (0.5 μs pulse width at 1 kilohertz (kHz) repetition rate) modes, as shown in FIG. 9. The tuning span observed in CW mode is 100 cm$^{-1}$ from this device, compared to 85 cm$^{-1}$ in pulsed mode. This indicates that the wavelength shift was mainly due to the Stark effect.

Figure 10:
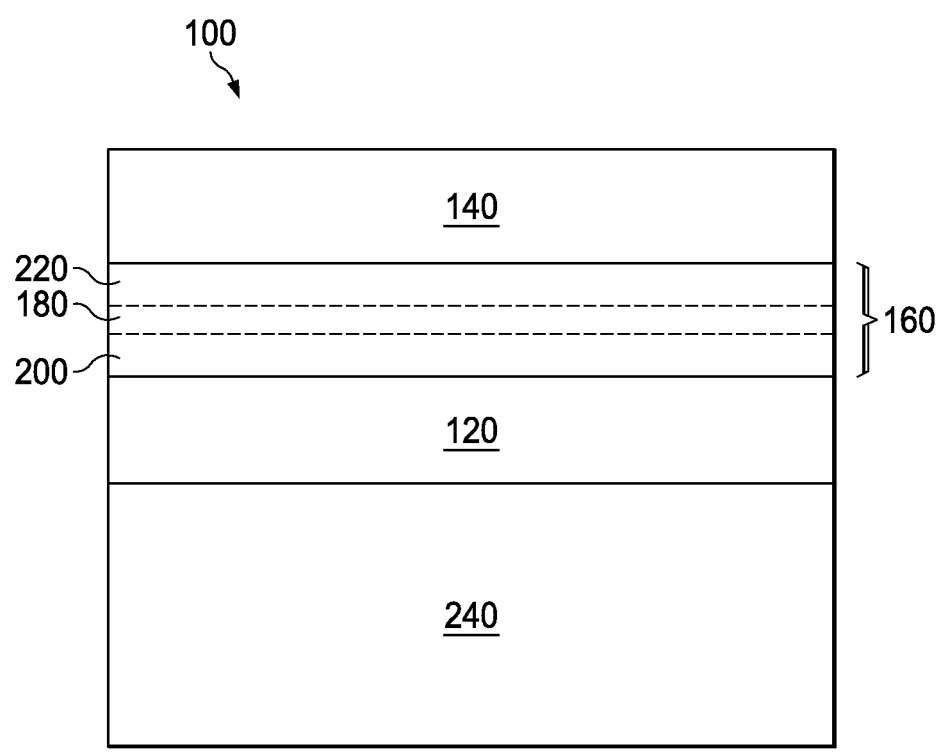
FIG. 10 is a schematic diagram of a tunable semiconductor laser device which contains at least one active gain region of the presently disclosed inventive concepts.

With reference now to FIG. 10, shown therein is a schematic diagram of a non-limiting embodiment of a tunable semiconductor laser device which contains at least one active gain region embodied by the presently disclosed inventive concepts. Such a tunable semiconductor laser device is designated in FIG. 10 by the general reference numeral 100. Laser device 100 includes a bottom cladding layer 120, a top cladding layer 140, and a waveguide core 160 positioned between the bottom cladding layer 120 and the top cladding layer 140. The waveguide core 160 comprises an active gain region 180 (such as embodied elsewhere herein), which is separated from the cladding layers 120 and 140 by a first separate confinement layer 200 and a second confinement layer 220. In this embodiment, the laser device 100 is grown on a substrate 240. The substrate 240 may comprise, for instance, InAs. The semiconductor laser devices of the presently disclosed inventive concepts can be manufactured by any known process.

FIG. 11 shows electron QW layer thicknesses, tuning rates, and tuning ranges of various laser structures. The structures are labeled R066, R084, R089 and R090 and were designed with different thicknesses for their electron QW layers, resulting in variations of electron distribution in their corresponding electron QW layers. The structures comprise an InAs/Ga$_{0.7}$In$_{0.3}$Sb/InAs active region QW structure, except that the active region of R090 has an additional Ga$_{0.7}$In$_{0.3}$Sb layer on the right. As shown, the thicknesses in Å of the layers for R066, R084, R089, and R090 are 24/29/21, 22/29/21, 22/29/23, and 22/29/21/29, respectively. R066 has 12 cascade stages, while the other structures have 8 cascade stages. The structures were grown using a generation-II molecular beam epitaxy (MBE) system on n$^+$-doped InAs substrates. The injection regions and waveguide structures are similar to ones described in U.S. patent application Ser. No. 14/262,326 filed Apr. 25, 2014 by Rui Qing Yang and titled "Hybrid Semiconductor Laser Absent a Top Semiconductor Cladding Layer ("Yang"), and in Tian, et al., "InAs-Based Mid-Infrared Interband Cascade Lasers Near 5.3 μm" ("Tian"), IEEE Journal of Quantum Electronics, vol. 48, no. 7, pp. 915-21, 2012, the entire contents of which are incorporated by reference herein.

After growth, the wafers were processed into 150 μm-wide broad-area and narrow-ridge (10 to 40 μm width) waveguide laser devices with both facets uncoated and mounted epi-side up on copper heat-sinks for measurement. The optical output power of the fabricated lasers was measured by a thermopile power meter for CW operation. A Fourier transform infrared spectrometer was used to acquire the lasing spectral characteristics.

Figure 12A:
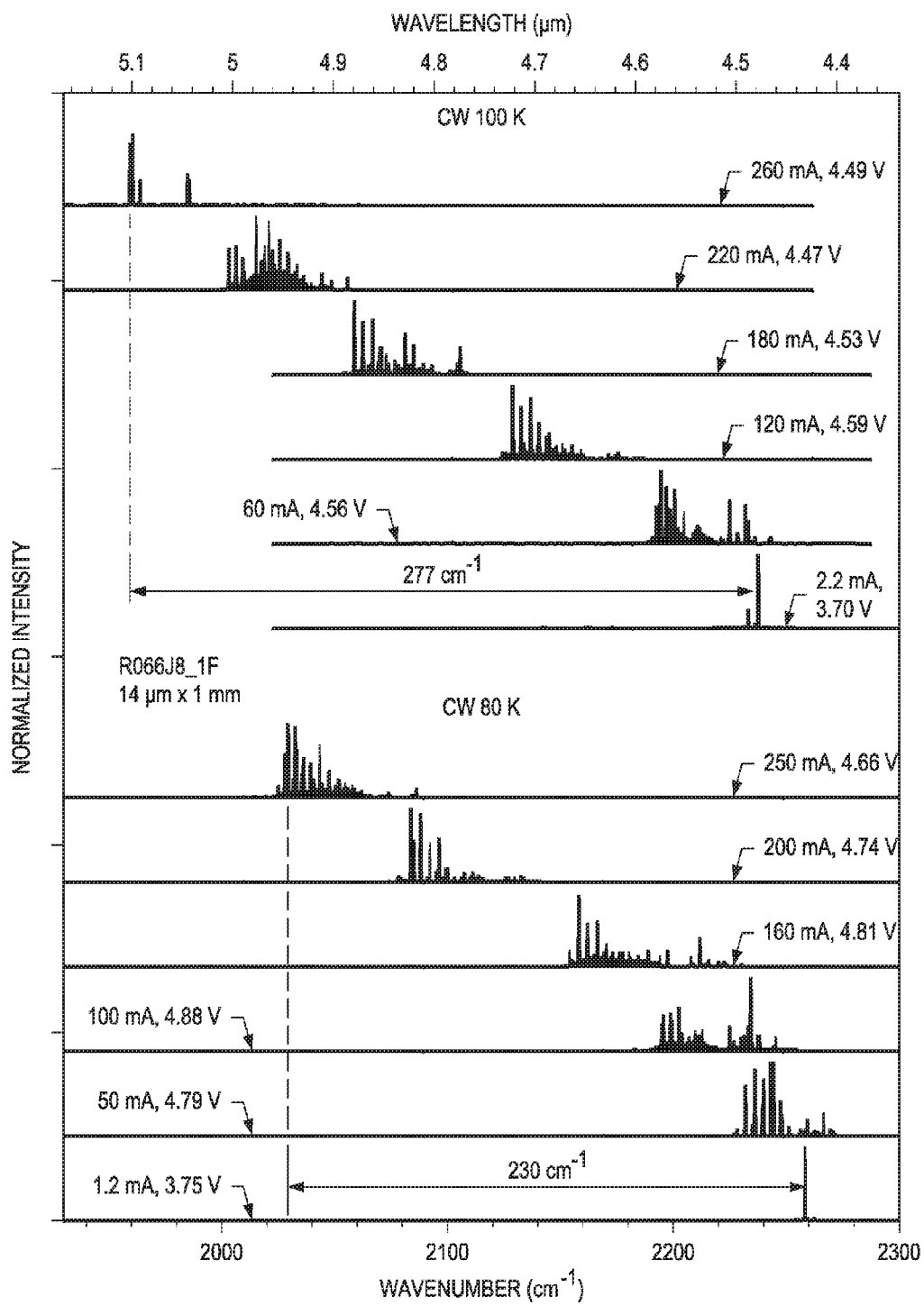
FIGS. 12A and 12B show CW lasing spectra, as well as operating voltage and lasing wavelength versus current, for a laser.
Figure 12B:
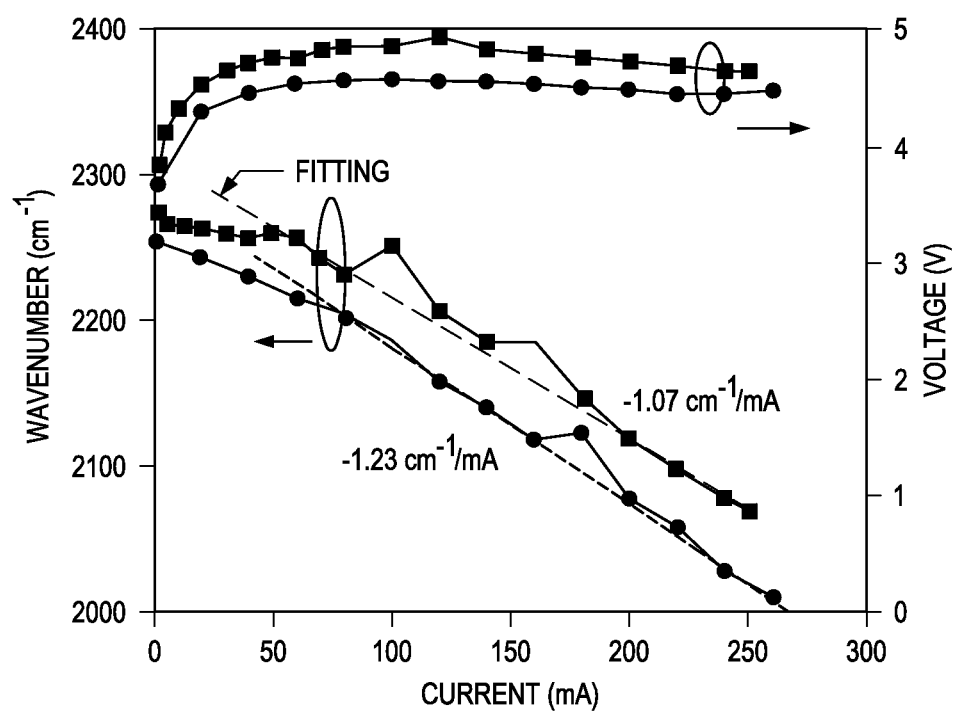

Narrow-ridge devices fabricated from wafer R066 had two significantly different etch depths, about 8 μm (denoted as deep etched) and 2 μm (denoted as shallow etched). A 14 μm-wide and 1 millimeter (mm)-long deep etched device operated at temperatures up to 213 K in CW mode and up to 280 K in pulsed mode, exhibiting unpredicted current-voltage characteristics as well as a wide wavelength tuning range at 80 K and 100 K in CW mode, as shown in FIGS. 12A and 12B. At 80 K, the lasing wavelength was tunable by 230 cm$^{-1}$ (wavenumber) from 4.43 μm near the threshold current of 1.2 mA to 4.93 μm at 250 mA. At 100 K, the lasing wavelength was tunable by about 280 cm$^{-1}$ from 4.47 at 2.2 mA to 5.10 μm at 260 mA. The tuning range of 280 cm$^{-1}$ corresponds to an energy change (ΔE) of 34.3 millielectronvolts (meV) or a wavelength shift (Δλ) of 630 nm, which may be the largest current tuning range achieved in a simple monolithically fabricated Fabry-Perot mid-IR laser. The threshold current density was 8.6 Å/cm$^2$ at 80 K, which was very similar to values obtained for other lasers fabricated from the same and related wafers. However, the threshold voltage at 80 K exhibited a slightly higher value of 3.75 volts (V) (voltage efficiency of 90%) than typical values (3.51-3.68 V) for other devices made in the same processing batch from the same wafer R066. This may indicate a relatively large electric field across the active regions, indicating that the electron wave function might be distributed more on the right-side electron QW layer for such a biasing voltage.

As shown in FIG. 12B, with further current increase, the operating voltage increased considerably to 4.97 V at 120 mA and then decreased slightly with additional current increase, instead of being pinned at the threshold value. Consequently, extra electric field was applied across the active regions that caused a redshift of the lasing wavelength. The wavelength tuning rate was relatively small at low currents and then increased strongly at higher currents. This increase is partially due to an additional thermal contribution. The average tuning rate was −0.15 cm$^{-1}$/(A/cm$^2$) (−1.07 cm$^{-1}$/mA) at 80 K and −0.17 cm$^{-1}$/(A/cm$^2$) (−1.23 cm$^{-1}$/mA) at 100 K. The heating effect is better described in terms of cm$^{-1}$/mA, while the Stark effect is better described with cm$^{-1}$/(A/cm$^2$). The slight decrease in operating voltage above 120 mA could be caused by combined effects of Joule heating and decreased series resistance at high currents and is not necessarily indicative of a reduced electric field across active regions. This decrease of operation voltage was not observed for other devices made from the same wafer.

Figure 13:
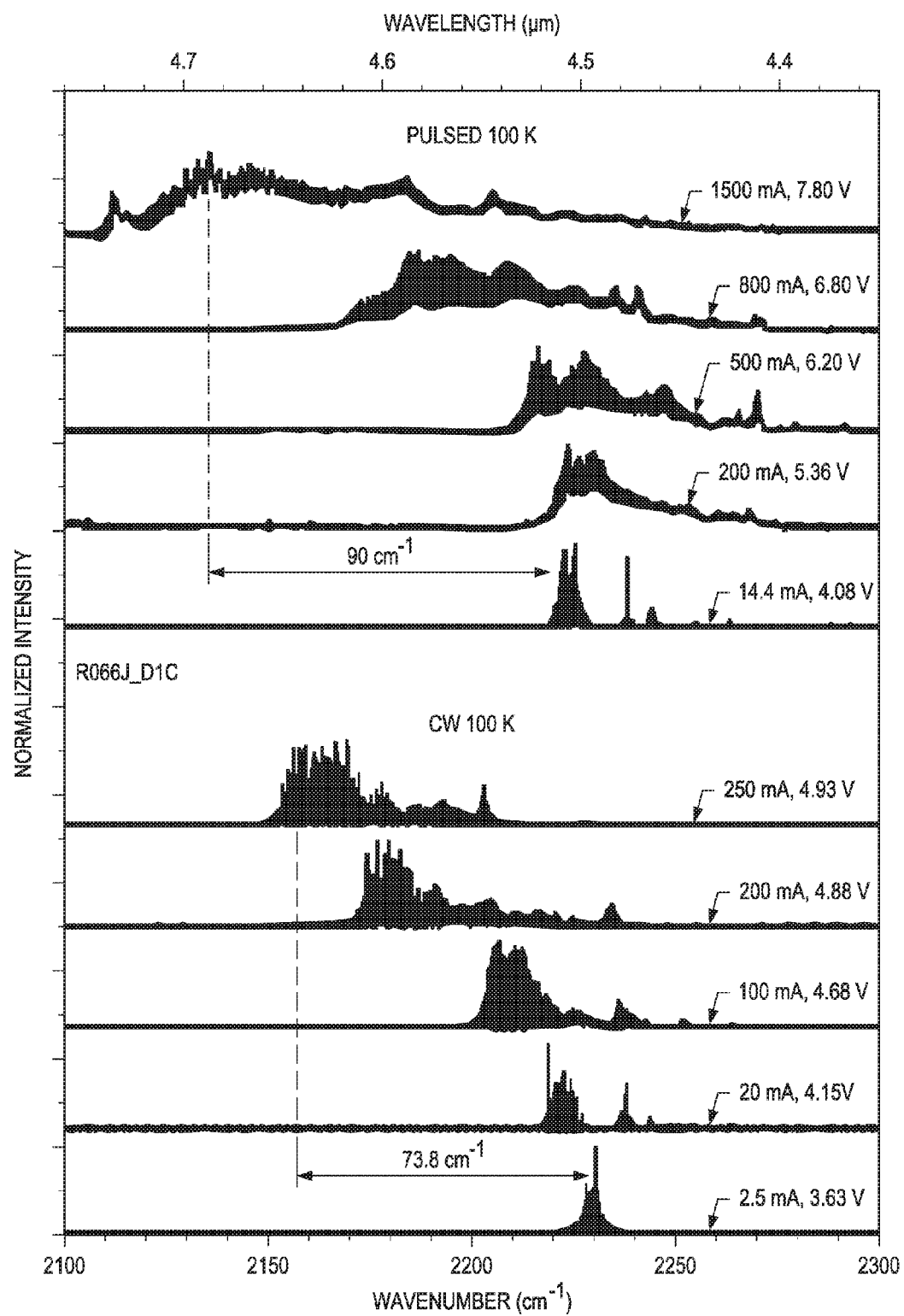
FIG. 13 shows lasing spectra of another laser for pulsed and CW conditions.

The current-tuned redshift was observed from other devices that were fabricated from the same wafer. FIG. 13 shows lasing spectra at various injection currents for another deep etched laser (14 μm×2 mm) made from wafer R066 for both CW and pulsed (1 μs pulse width, 5 kHz repetition rate) conditions at 100 K. An average tuning rate of −0.073 cm$^{-1}$/(A/cm$^2$) (−0.26 cm$^{-1}$/mA) was observed from the laser at 100 K in CW operation and became −0.10 cm$^{-1}$/(A/cm$^2$) (−0.36 cm$^{-1}$/mA) at 120 K (not shown), which was smaller than the value of −0.17 cm$^{-1}$/(A/cm$^2$) (−1.23 cm$^{-1}$/mA) obtained from the device in FIG. 12. This laser had a lower threshold voltage (3.63 V at 100 K), and the operating voltage consistently increased with the current. In pulsed operation, the redshift was initially very small and the tuning rate was about −0.02 cm$^{-1}$/(A/cm$^2$) (−0.071 cm$^{-1}$/mA) with a range of about 90 cm$^{-1}$ for a large current up to 1.5 A. The pulsed-operation tuning rate is significantly lower than that for CW operation, indicating that heating may play an important role in the redshift tuning for CW operation. For the shallow-etched devices, redshift tuning was also observed in CW operation, but with an about 20% smaller tuning range. This indicates that the heating effect was more significant in deep-etched devices. In order to reduce the heating effect, shallow-etched devices with etch depths of 2-3 μm were fabricated from other wafers.

To examine the behavior described by equation 1, wafers R084, R089, and R090, in contrast to wafer R066, were designed with a narrower left-side electron QW layer thickness to push the electron wave function more to the right-side electron QW layer for low-voltage operation. Broad-area devices made from wafer R084 lased at temperatures up to 180 K in CW mode (320 K in pulsed mode) with a lasing wavelength from 4.35 μm at 80 K to 5.1 μm at 300 K. The lasers had low threshold current densities (e.g., 4.5 Å/cm$^2$ with a threshold voltage of 2.8 V) and nominal output powers (e.g., approximately 162 mW/facet at 600 mA, an underestimation not including the correction due to the beam divergence) at 80 K.

FIGS. 7A-7B illustrates the lasing spectral characteristics of a broad-area device (150 μm×1.48 mm) fabricated from wafer R084 in CW operation at 120 K for different currents (FIG. 7A), and how its lasing wavelength and operating voltage changed at five different temperatures from 100 to 180 K (FIG. 7B). The lasing wavelength tuning rate is small for low currents at low temperatures and increases rapidly for high currents at high temperatures. At 120 K, the wavelength was redshifted over a range of 151 cm$^{-1}$ with a tuning rate of −1.1 cm$^{-1}$/(A/cm$^2$) (−0.5 cm$^{-1}$/mA) at relatively high currents. However, in pulsed operation, the lasing wavelength was nearly unchanged with current.

Additionally, the narrow-ridge (15 μm×2 mm) laser from the same wafer redshifted at the much lower rate of −0.039 cm$^{-1}$/(A/cm$^2$) (0.13 cm$^{-1}$/mA) in CW mode and −0.012 cm$^{-1}$/(A/cm$^2$) (−0.04 cm$^{-1}$/mA) in pulsed mode at 160K with current up to 500 mA. The reduced tuning rate was likely due to the better heat dissipation in the narrow ridge laser device, further supporting the heating effect on redshift in CW operation. In contrast, for laser devices in which the electron wavefunction was mainly in the left-side electron QW layer, the lasing wavelength was nearly unchanged with current in CW operation. Furthermore, the wavelength shift due to the temperature increase with current based on the extracted thermal resistance is considerably smaller than the observed tuning range. For example, the lasing wavelength of the broad-area laser at 120 K was shifted by 129 nm (FIG. 7B) when the current was increased from 280 to 400 mA, which is significantly larger than the estimated heating-induced shift of 50 nm (contributing approximately 39% in this increment) based on an extracted thermal resistance of 54 K/watt (W) and a temperature tuning coefficient of 3.4 nm/K. Also, Joule heating alone will not cause the abrupt change of tuning rate shown in FIGS. 7A-7B. Such a change may be indicative of an adjustment of electron distribution over the active region related to the Stark effect. Hence, the large lasing redshift is caused by combined contributions of the Stark effect associated with specific QW structures and the heating effect.

Broad-area devices made from wafer R089 lased at temperatures up to 212 K near 5.25 μm (4.73 μm at 80 K) in CW mode and up to 270 K in pulsed mode near 5.42 μm. At 80 K, the threshold current density was 9.3 Å/cm$^2$ and the output power exceeded 120 mW/facet at 700 mA. The broad-area devices made from wafer R090 lased at temperatures up to 185 K near 5.15 μm (4.76 μm at 80 K) in CW mode and 257 K in pulsed mode near 5.3 μm. Their overall performance was worse than that of the devices made from wafer R084 in threshold current density, CW output power, and maximum pulsed operating temperature. Narrow-ridge devices were also made from both wafers. A narrow-ridge (10 μm×1.7 mm) laser from wafer R089 lased at temperatures up to 253 K near 5.36 μm in CW mode and up to 280 K in pulsed mode near 5.48 μm, while a narrow-ridge (15 μm×1.5 mm) laser from wafer R090 lased at temperatures up to 228 K near 5.17 μm in CW mode and up to 257 K in pulsed mode near 5.29 μm.

Figure 14:
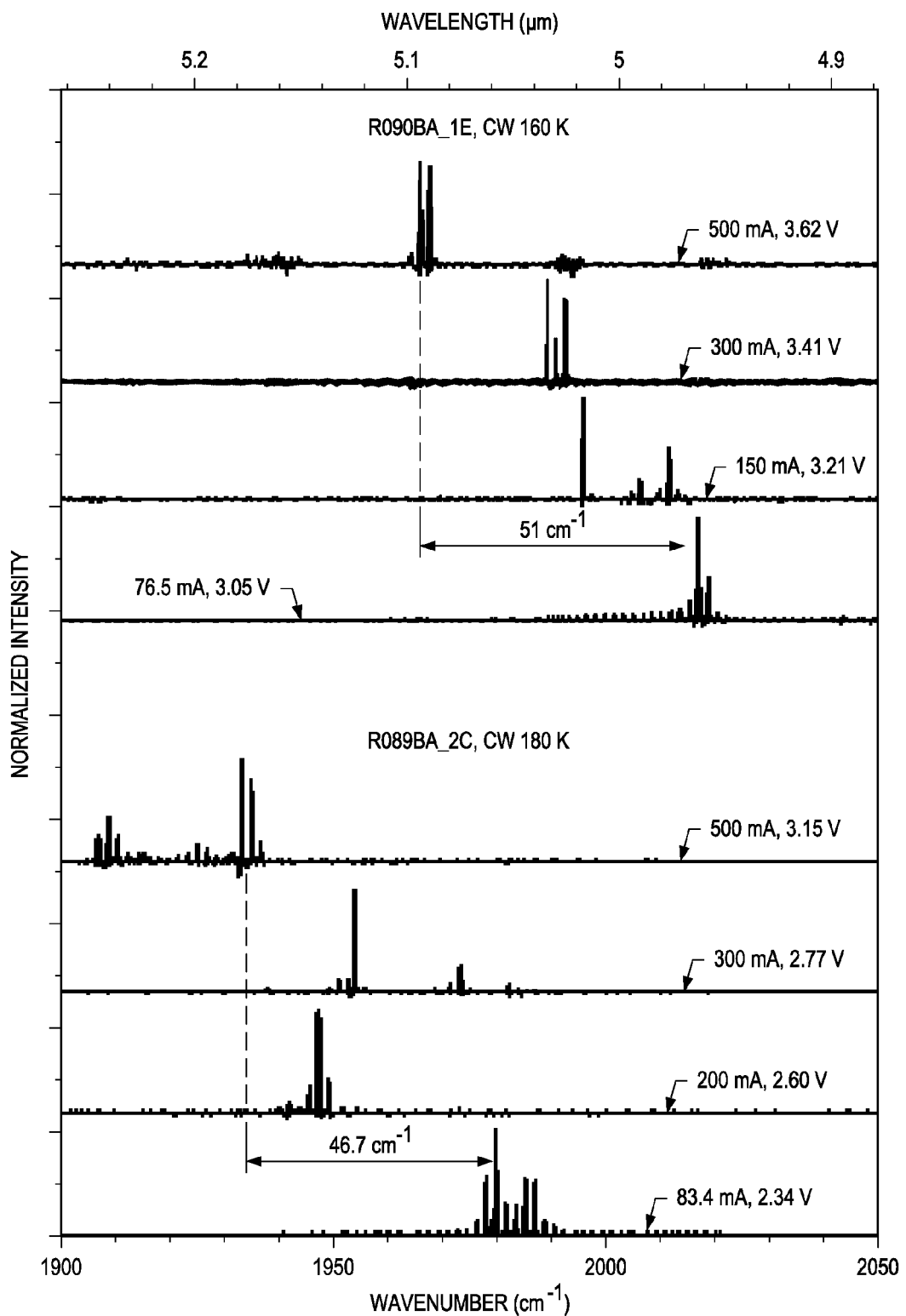
FIG. 14 shows lasing spectra of yet another laser for CW conditions.

In CW operation, the lasing wavelengths of all devices made from R089 and R090 exhibited large redshifts with current as shown in FIG. 14. At 180K, the lasing wavelength was shifted by 46.7 cm$^{-1}$ for a broad area device from R089 with a tuning rate of about −0.11 cm$^{-1}$/mA. At 160K, a shift of 51 cm$^{-1}$ was observed for a broad area laser from wafer R090 with a tuning rate of −0.12 cm$^{-1}$/mA. The tuning rates of devices made from wafers R089 and R090 were lower compared with the devices fabricated from wafer R084 as shown in FIG. 7A-7B. This is because these devices had improved thermal dissipation due to better mounting as evidenced by their higher CW operating temperatures, though their maximum pulsed operating temperatures were lower than those in devices from R084. Enhanced tuning rate with a wider range could be achieved with a high thermal resistance at a price of a reduced CW operating temperature. In pulsed operation, a redshift with current was essentially not observed from devices made from either wafer. The results also indicated that the additional $Ga_{0.7}In_{0.3}Sb$ hole QW layer in the active region in R090 did not have any substantial impact on the wavelength tuning.

Figure 15:
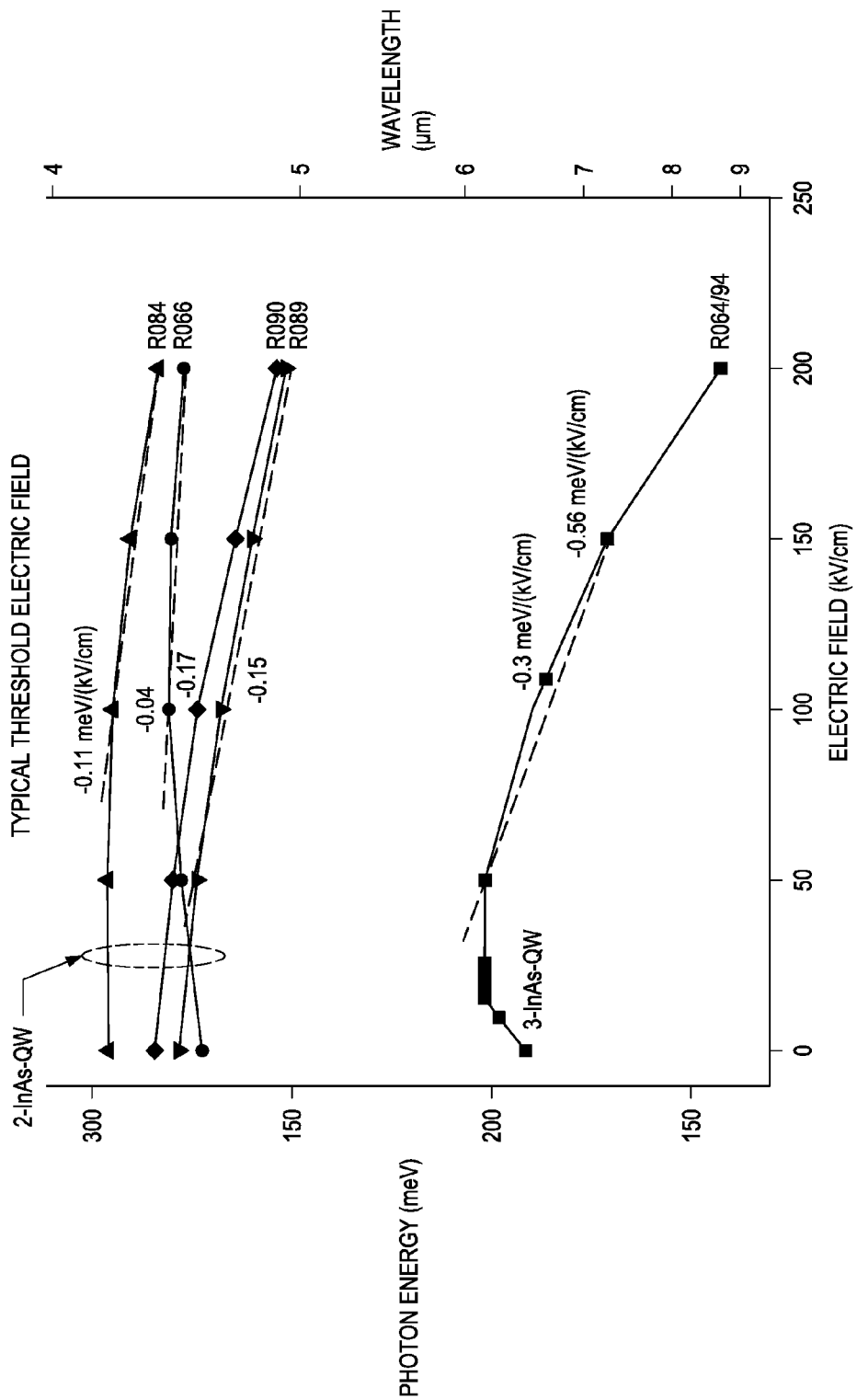
FIG. 15 shows calculated interband transition energy and tuning rates for various laser designs.

Returning to FIG. 11, devices made from R066 exhibited tuning ranges and rates that are larger than those from other wafers at a similar wavelength. This is in contradiction with the theoretically calculated results based on the Stark effect (see FIG. 15) and may be the result of subtleties associated with device fabrication. The Stark effect alone would not usually result in lasing wavelength tuning. This is because, in an ideal semiconductor laser, carrier concentration is pinned at the threshold and thus the lasing wavelength will not shift with further increase of injection current above threshold. Therefore, even if the electroluminescent emission can be tuned largely by the Stark effect in cascade emitting devices, it is unlikely for the above-threshold lasing wavelength shift to be based exclusively on the Stark effect.

To unclamp the pinning of the carrier concentration, techniques to slow down lasing that allow continued increase of voltage across the active region were investigated. For QC lasers, a coupling state is inserted between the injection region and the active region. As a result, the electron transit across the active region was delayed allowing the increase in applied voltage after lasing. For interband lasers, collection quantum wells, or charge accumulation layers, were introduced via the insertion of a thick tunneling barrier so that carriers were accumulated before recombining in the active region, leading to some increase of the voltage across the active region. For the above IC laser structures, substantial redshifts were observed in CW operation, while the shift was either small or essentially zero in pulsed operation. This may indicate that the heating effect unlocks the carrier concentration pinning at the threshold and then the Stark effect provides positive feedback that enhances the redshift as both effects have the same direction of wavelength shift. This is distinctively different from previous IC laser structures with electron wave functions located mainly in the left-side electron QW layer, where the heating and Stark effects shift the wavelength in opposite directions from each other.

However, real semiconductor lasers are not ideal, and their carrier concentrations will not necessarily be pinned at the threshold. A non-pining of the carrier density above threshold was observed in previous IC lasers, particularly at high temperatures. Practically, the non-ideal conditions such as low tunneling efficiency and additional transition states may slow down the lasing process and result in a wavelength shift after lasing. IC lasers with three electron QW layers exhibit substantial wavelength tuning, even for pulsed conditions without heating.

IC lasers with three electron QW layers were fabricated. R064 and R094, wafers with a nominally identical IC laser structure, were grown separately to verify the reproducibility. The injection region and waveguide structure (with 15 cascade stages) were similar to an IC structure without the top semiconductor cladding layer described in Yang and Tian. The active region comprised InAs/GaInSb/InAs/GaInSb/InAs QW layers with thicknesses of 28/33/25/36/21 in Å from left to right, respectively.

Figure 16A:
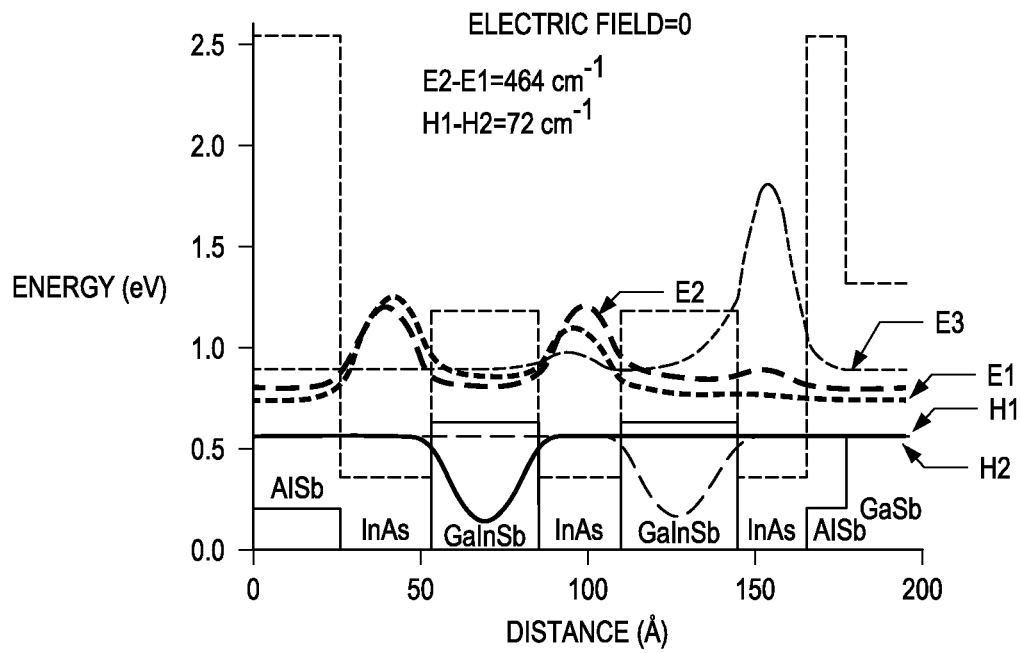
FIGS. 16A, 16B, and 16C show carrier distributions for a laser structure with three electron QW layers at various electric fields.
Figure 16B:
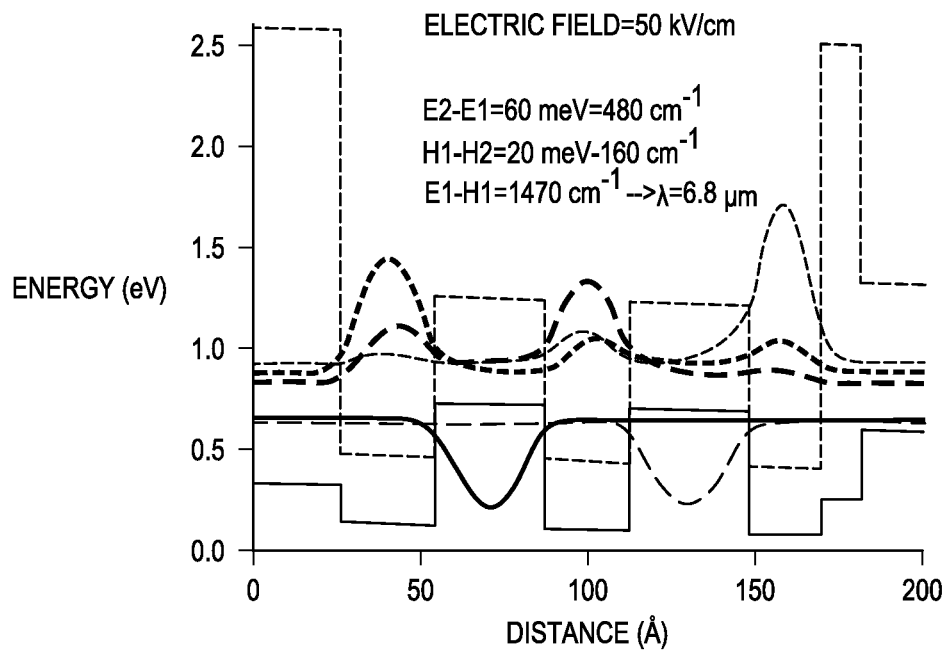
Figure 16C:
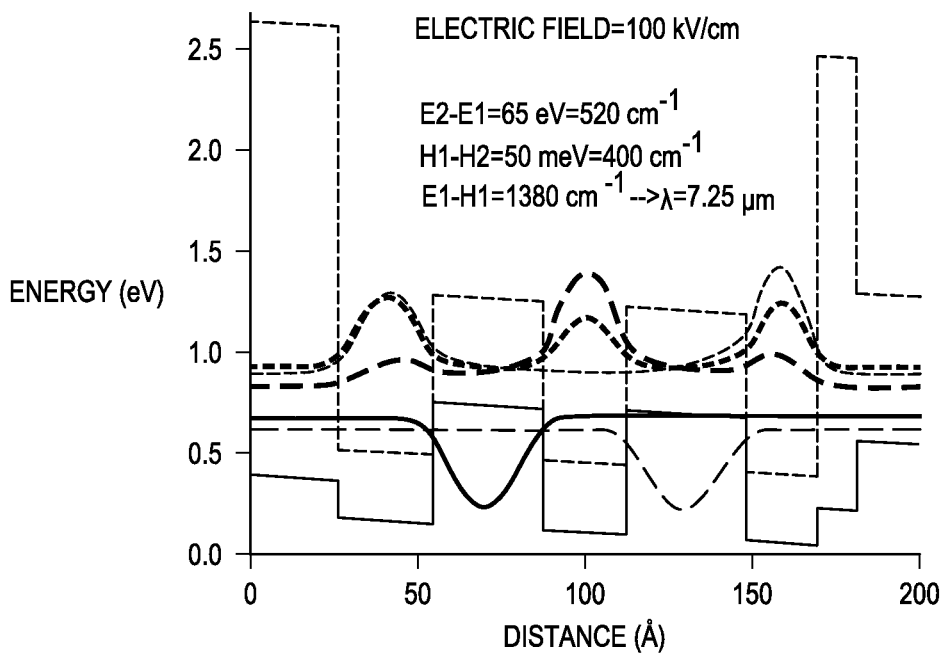

The calculated carrier distributions are depicted in FIGS. 16A-C in the active region for three different electric fields. In FIG. 16A, the three lowest Eigen energy levels for electron are labeled E1, E2, and E3, and the two lowest Eigen energy levels for heavy hole are labeled H1 and H2. The energy separations between excited state and ground state are shown. The interband transition is indicated by the dashed arrow, and the corresponding lasing wavelength is also given. Without an electric field applied, the two heavy-hole states have very similar energies, while the electron ground-state resides mainly in the left-side electron QW layer. When an electric field is applied with an external forward bias to the device, the electron ground-state quickly moves to the middle electron QW layer and the heavy-hole ground-state shifts to the left hole QW layer, resulting in a positive value of $(z_e\text{-}z_h)$. As the electric field continues to increase, the energy separation between the two heavy-hole states becomes larger and the lasing transition likely occurs between the electron and heavy-hole ground states with a further positive value of $(z_e\text{-}z_h)$. As such, the Stark effect will result in an emission wavelength redshift with the electric field.

Returning to FIG. 15, the calculated interband transition energies as a function of the electric field for the devices with two and three electron QW layers are compared. The calculation shows a larger shift for the design with three electron QW layers after the external field exceeds the typical threshold value. This is because the electron wave function is extended further to the right-hand side with an additional electron QW layer in the active region (see FIG. 15), while the ground hole state remains mostly in the left hole QW layer, resulting in a much larger value for the interband dipole $(z_e\text{-}z_h)$. Consequently, the redshift of emission wavelength may be enhanced significantly according to equation 1 in the design with 3 electron QW layers compared to the design with 2 electron QW layers.

The narrow-ridge lasers without the top thick gold layer and coating made from R064 lased at temperatures up to 188 K in CW mode and up to 200 K in pulsed mode with an emission wavelength up to 7.6 µm (6.7 µm at 80 K). The observed lasing wavelength was similar to the calculated value shown in FIG. 15. The device performance was significantly improved compared to previous results from early InAs-based IC lasers at a similar wavelength.

Figure 17:
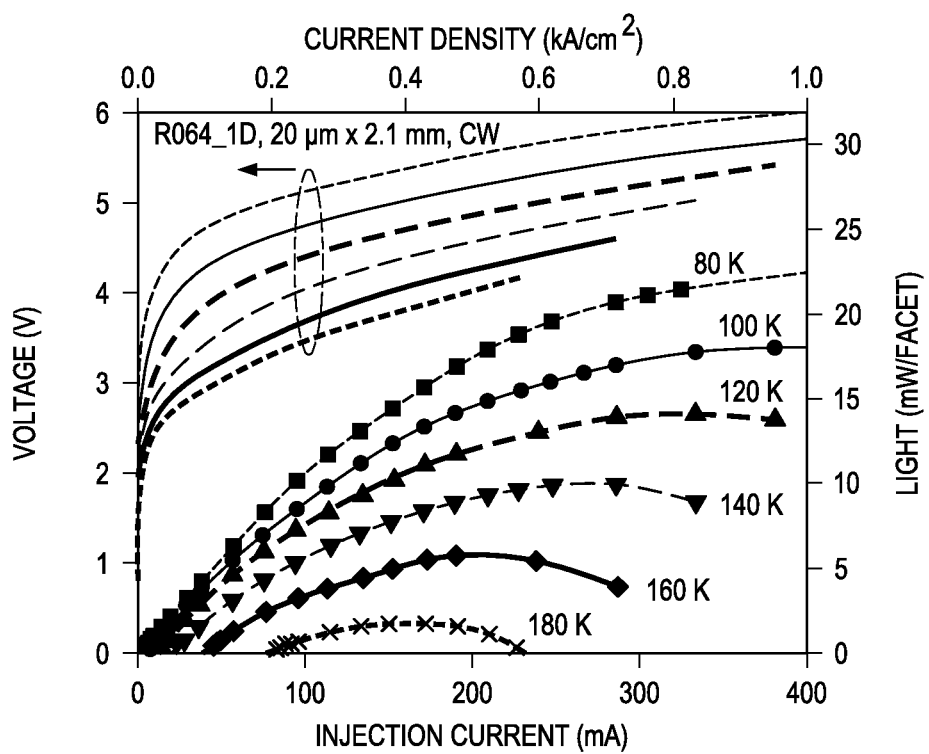
FIG. 17 shows light-current-voltage characteristics of an IC laser at different heat sink temperatures in CW mode.

FIG. 17 shows CW light, current, and voltage characteristics of a 20 µm-wide and 2.1 mm-long IC laser at various operating temperatures. The output power exceeded 22 mW/facet, and the threshold current density was 10 A/cm$^2$ at 80 K. However, the threshold current density of this device increased relatively quickly with increasing temperature. The characteristic temperature ($T_0$) of 30.5 K is lower than the typical value (>40 K) for an IC laser with 2 electron QW layers. This may be due to the reduced wave function overlap between the two interband transition states in the active region with 3 electron QW layers and a lasing wavelength at the longer wavelength.

To investigate the electrical tuning properties of the structure with 3 electron QW layers, lasing spectra of the IC lasers for different injection currents were collected at different heat-sink temperatures. FIG. 8 shows a series of CW lasing spectra from a 15 µm-wide laser at 80 K for injection current increasing from 2.2 to 360 mA and corresponding bias voltage from 3.6 to 6.7 V, respectively. In this electrical injection range, the lasing wavelength redshifted by about 180 cm$^{-1}$ (22 meV or 900 nm) with a tuning rate of −0.49 cm$^{-1}$/mA. The tuning range covers over 12.5% of the center emission wavelength, indicating significant electrical tuning. To examine the contribution of the heating effect, the lasing spectra of a 40 μm-wide ridge device were measured at 80 K in CW and pulsed (0.5 μs pulse width at 1 kHz repetition rate) modes as shown in FIG. 9. The tuning span observed in CW mode is 100 cm$^{-1}$ (13 meV) from this device compared to 85 cm$^{-1}$ (11 meV) in pulsed mode (same maximum current up to 500 mA). This indicates that the wavelength shift was mainly due to the Stark effect. Lasing wavelengths of six other devices with different ridge width sizes (15-40 μm wide) were also examined at 80 K. Those devices had similar redshifts versus the injection current density (average tuning coefficient of approximately 0.13 cm$^{-1}$/(A/cm$^2$)).

Both narrow-ridge and broad-area devices made from wafer R094 were also investigated. Those devices had threshold current densities of 10-14 Å/cm$^2$ at 80 K, which are comparable to devices from R064. They all exhibited substantial redshifts with increasing injection current in both CW and pulsed modes. For example, a 20 μm-wide and 3 mm-long IC laser at 80 K had a lasing wavelength redshift of 132 cm$^{-1}$ in CW mode and 99 cm$^{-1}$ in pulsed mode when current was increased from 8 mA to 450 mA. This verifies that the structure with 3 electron QW layers is promising and effectively unclamps the carrier concentration pinning, leading to significant current tuning of the lasing wavelength associated with a large value of the dipole ($z_e$-$z_h$) for an enhanced Stark effect. This might be attributed to more substantial electron wave function spreading into the multiple QWs and a consequent reduction in wave function overlap with the localized hole state, resulting in an effective slowdown of the lasing process. The large dipole ($z_e$-$z_h$) for the enhanced linear Stark effect in the design with 3 QW layers leads to a strong electrical tuning in a wide range at a cost of possibly higher threshold current density and reduced maximum operating temperature compared to the design with 2 QW layers.

Thus, in at least certain embodiments, electrically tunable interband cascade lasers of the presently disclosed inventive concepts have been demonstrated to have a wide tuning span of about 280 cm$^{-1}$ (34 meV or 630 nm) near 4.5 μm and about 180 cm$^{-1}$ (22 meV or 900 nm) near 7 μm. The wide wavelength tuning was achieved by making the Stark effect wavelength shift in the same direction as the wavelength shift due to the heating effect with current injection. As such, both effects provided positive feedback to each other to enhance the lasing redshift with electrical current. The mutually enhancing Stark and heating effects may also be applied to QC lasers, allowing a strongly tuned redshift instead of the usual blueshift used up to now. Furthermore, by comparing the designs with 2 and 3 electron QW layers, it is shown that a strong electrical tuning with a large range can be achieved in both CW and pulsed modes through adjusting the electron wave function and the interband dipole.

In at least certain non-limiting embodiments, the presently disclosed inventive concepts include a tunable semiconductor laser having a higher bias voltage end, a lower bias voltage end, and an optically active gain region having (1) a band-gap configured to emit light at an emission wavelength that is tunable when an electric field is generated across the optically active gain region by applying a bias voltage thereto, (2) at least a first electron quantum well (QW) layer positioned closer to the higher bias voltage end than the lower voltage bias end; and (3) at least a first hole QW layer positioned closer to the lower bias voltage end than the higher bias voltage end and comprising a type-II band alignment with the first electron QW layer such that the band-gap is determined by an energy difference between a ground electron state in the first electron QW layer and a ground hole state in the first hole QW layer, and wherein the emission wavelength is redshifted upon an increase in a bias voltage applied to the optically active gain region. In certain embodiments, the laser may include a plurality of the optically active gain regions, and may further include a plurality of injection regions, wherein the optically active gain regions are separated by the injection regions and stacked in series to form an interband cascade (IC) laser. In certain embodiments of the laser, the optically active gain region may include one or more semiconductor layers selected, for example, from the group consisting of indium arsenide (InAs), indium arsenide antimonide (InAsSb), indium gallium arsenide (InGaAs), InGaAsSb, gallium antimonide (GaSb), gallium indium antimonide (GaInSb), aluminum gallium antimonide (AlGaSb), aluminum gallium indium antimonide (AlGaInSb), gallium arsenide (GaAs), aluminum antimonide (AlSb), aluminum arsenide (AlAs), aluminum indium antimonide (AlInSb), aluminum antimonide arsenide (AlSbAs), aluminum gallium antimonide arsenide (AlGaSbAs), and aluminum indium gallium antimonide arsenide (AlInGaSbAs). In certain embodiments, the laser may be constructed with a substrate, selected for example, from the group consisting of indium arsenide (InAs), indium phosphide (InP), gallium arsenide (GaAs), gallium antimonide (GaSb), and silicon (Si). The first electron QW layer may comprise indium arsenide (InAs) and the first hole QW layer may comprise gallium indium antimonide ($Ga_{1-x}In_xSb$), for example wherein x is in a range of about 0.2 to about 0.4. In certain embodiments of the laser, the first hole QW layer has a thickness in a range of about 23 angstroms (Å) to about 35 Å. In certain embodiments, of the laser, the first electron QW layer has a thickness in a range of about 15 Å to about 40 Å. In certain embodiments of the laser, the optically active gain region may include a second electron QW layer positioned between the first hole QW layer and the lower bias voltage end; a first center of a hole wave function for a ground valence band state; and a second center of an electron wave function for a ground conduction band state that is closer to the higher bias voltage end than the first center. In certain embodiments, the laser includes a first barrier layer; and a second barrier layer, wherein the first barrier layer and the second barrier layer together enclose the optically active gain region. The first barrier layer may be constructed completely or in part of, for example, aluminum antimonide (AlSb), the first electron QW layer may be constructed completely or in part of, for example, indium arsenide (InAs), the first hole QW layer may be constructed completely or in part of, for example, gallium indium antimonide ($Ga_{1-x}In_xSb$), wherein x is in a range of about 0.2 to about 0.4, the second electron QW layer may be constructed completely or in part of, for example, InAs, and the second barrier layer may be constructed completely or in part of, for example, AlSb. In certain embodiments of the laser, the first electron QW layer has a first electron QW layer thickness, the first hole QW layer has a first hole QW layer thickness, and the second electron QW layer has a second electron QW layer thickness. In certain embodiments of the laser, the first hole QW layer thickness is in a range of about 25 Å to about 35 Å. In certain embodiments of the laser, the first electron QW layer thickness is in a range of about 15 Å to about 50 Å. In certain embodiments of the laser, the second electron QW layer thickness is about 60% to about 110% of the first electron QW layer thickness. In certain embodiments of the laser, the optically active gain region includes a third electron QW layer having a third electron QW layer thickness; and a second hole QW layer having a second hole QW layer thickness, wherein the second electron QW layer, the first hole QW layer, the first electron QW layer, the second hole QW layer, and the third electron QW layer are positioned sequentially in that order, whereby the second electron QW layer is positioned closer to the lower bias voltage end than the first electron QW layer, the first electron QW layer is positioned closer to the higher bias voltage end than the second electron QW layer, the first hole QW layer is positioned closer to the lower bias voltage end than the second hole QW layer, and the second hole QW layer is positioned closer to the higher bias voltage end than the first hole QW layer. In certain embodiments of the laser, the first electron QW layer, the second electron QW layer, and the third electron QW layer may be constructed completely or in part of, for example, indium arsenide (InAs), and the first hole QW layer and the second hole QW layer may be constructed completely or in part of, for example, gallium indium antimonide ($Ga_{1-x}In_xSb$), wherein x is in a range of about 0.2 to about 0.4. Further, in certain embodiments of the laser, the second hole QW layer thickness is in a range of about 20 Å to about 40 Å, the first hole QW layer thickness is in a range of about 80% to about 115% of the second hole QW layer thickness, the third electron QW layer thickness is in a range of about 12 Å to about 35 Å, the first electron QW layer thickness exceeds the third electron QW layer thickness by about 10% to about 20%, and the second electron QW layer thickness exceeds the first electron QW layer thickness by about 10% to about 20%.

All of the compositions, devices, and/or methods disclosed herein can be made and executed without undue experimentation in light of the present disclosure. While the compositions, devices and methods of this presently disclosed inventive concepts have been described in terms of particular examples and embodiments, it will be apparent to those of skill in the art that variations may be applied to the devices, compositions and/or methods and in the steps or in the sequence of steps of the method described herein without departing from the concept, spirit and scope of the presently disclosed inventive concepts. All such similar substitutes and modifications apparent to those skilled in the art are deemed to be within the spirit, scope and concept of the inventive concepts as defined by the appended claims. Moreover, the following claims are exemplary claims supported by the present disclosure and are not intended to be limiting of the claims which can be pursued in subsequent patent applications based on the present application.

What is claimed is:

1. A tunable semiconductor laser comprising:
a higher bias voltage end;
a lower bias voltage end; and
an optically active gain region comprising:
a band-gap configured to emit light at an emission wavelength that is tunable when an electric field is generated across the optically active gain region by applying a bias voltage thereto;
at least a first electron quantum well (QW) layer positioned closer to the higher bias voltage end than the lower bias voltage end; and
at least a first hole QW layer positioned closer to the lower bias voltage end than the higher bias voltage end and comprising a type-II band alignment with the first electron QW layer such that the band-gap is determined by an energy difference between a ground electron state in the first electron QW layer and a ground hole state in the first hole QW layer,
wherein the emission wavelength is redshifted upon an increase in the bias voltage applied to the optically active gain region during lasing.

2. The tunable semiconductor laser of claim 1, further comprising a plurality of the optically active gain regions.

3. The tunable semiconductor laser of claim 2, further comprising injection regions, wherein the optically active gain regions are separated by the injection regions and stacked in series to form an interband cascade (IC) laser.

4. The tunable semiconductor laser of claim 1, wherein the optically active gain region comprises one or more semiconductor layers selected from the group consisting of indium arsenide (InAs), indium arsenide antimonide (InAsSb), indium gallium arsenide (InGaAs), InGaAsSb, gallium antimonide (GaSb), gallium indium antimonide (GaInSb), aluminum gallium antimonide (AlGaSb), aluminum gallium indium antimonide (AlGaInSb), gallium arsenide (GaAs), aluminum antimonide (AlSb), aluminum arsenide (AlAs), aluminum indium antimonide (AlInSb), aluminum antimonide arsenide (AlSbAs), aluminum gallium antimonide arsenide (AlGaSbAs), and aluminum indium gallium antimonide arsenide (AlInGaSbAs).

5. The tunable semiconductor laser of claim 1, further comprising a substrate selected from the group consisting of indium arsenide (InAs), indium phosphide (InP), gallium arsenide (GaAs), gallium antimonide (GaSb), and silicon (Si).

6. The tunable semiconductor laser of claim 1, wherein the first electron QW layer comprises indium arsenide (InAs) and the first hole QW layer comprises gallium indium antimonide ($Ga_{1-x}In_xSb$), and wherein x is in a range of about 0.2 to about 0.4.

7. The tunable semiconductor laser of claim 6, wherein the first hole QW layer has a thickness in a range of about 23 angstroms (Å) to about 35 Å.

8. The tunable semiconductor laser of claim 6, wherein the first electron QW layer has a thickness in a range of about 15 Å to about 40 Å.

9. The tunable semiconductor laser of claim 1, wherein the optically active gain region further comprises:
a second electron QW layer positioned between the first hole QW layer and the lower bias voltage end;
a first center of a hole wave function for a ground valence band state; and
a second center of an electron wave function for a ground conduction band state that is closer to the higher bias voltage end than the first center.

10. The tunable semiconductor laser of claim 9, further comprising:
a first barrier layer; and
a second barrier layer, wherein the first barrier layer and the second barrier layer together enclose the optically active gain region.

11. The tunable semiconductor laser of claim 10, wherein the optically active gain region comprises one or more semiconductor layers selected from the group consisting of indium arsenide (InAs), indium arsenide antimonide (InAsSb), indium gallium arsenide (InGaAs), InGaAsSb, gallium antimonide (GaSb), gallium indium antimonide (GaInSb), aluminum gallium antimonide (AlGaSb), aluminum gallium indium antimonide (AlGaInSb), gallium arsenide (GaAs), aluminum antimonide (AlSb), aluminum arsenide (AlAs), aluminum indium antimonide (AlInSb), aluminum antimonide arsenide (AlSbAs), aluminum gallium antimonide arsenide (AlGaSbAs), and aluminum indium gallium antimonide arsenide (AlInGaSbAs).

12. The tunable semiconductor laser of claim 10, further comprising a plurality of the optically active gain regions.

13. The tunable semiconductor laser of claim 12, further comprising a plurality of injection regions, wherein the optically active gain regions are separated by the injection regions and stacked in series to form an interband cascade (IC) laser.

14. The tunable semiconductor laser of claim 10, wherein the first barrier layer comprises aluminum antimonide (AlSb), the first electron QW layer comprises indium arsenide (InAs), the first hole QW layer comprises gallium indium antimonide ($Ga_{1-x}In_xSb$), the second electron QW layer comprises InAs, and the second barrier layer comprises AlSb, and wherein x is in a range of about 0.2 to about 0.4.

15. The tunable semiconductor laser of claim 9, wherein the first electron QW layer has a first electron QW layer thickness, the first hole QW layer has a first hole QW layer thickness, and the second electron QW layer has a second electron QW layer thickness.

16. The tunable semiconductor laser of claim 15, wherein the first hole QW layer thickness is in a range of about 25 Å to about 35 Å.

17. The tunable semiconductor laser of claim 15, wherein the first electron QW layer thickness is in a range of about 15 Å to about 50 Å.

18. The tunable semiconductor laser of claim 15, wherein the second electron QW layer thickness is about 60% to about 110% of the first electron QW layer thickness.

19. The tunable semiconductor laser of claim 15, wherein the optically active gain region further comprises:
    a third electron QW layer having a third electron QW layer thickness; and
    a second hole QW layer having a second hole QW layer thickness,
    wherein the second electron QW layer, the first hole QW layer, the first electron QW layer, the second hole QW layer, and the third electron QW layer are positioned sequentially in that order whereby the second electron QW layer is positioned closer to the lower bias voltage end than the first electron QW layer, the first electron QW layer is positioned closer to the higher bias voltage end than the second electron QW layer, the first hole QW layer is positioned closer to the lower bias voltage end than the second hole QW layer, and the second hole QW layer is positioned closer to the higher bias voltage end than the first hole QW layer.

20. The tunable semiconductor laser of claim 19, further comprising:
    a first barrier layer; and
    a second barrier layer, wherein the first barrier layer and the second barrier layer together enclose the optically active gain region.

21. The tunable semiconductor laser of claim 20, further comprising a plurality the optically active gain regions.

22. The tunable semiconductor laser of claim 21, further comprising a plurality of injection regions, wherein the optically active gain regions are separated by the injection regions and stacked in series to form an interband cascade (IC) laser.

23. The tunable semiconductor laser of claim 19, wherein the first electron QW layer, the second electron QW layer, and the third electron QW layer comprise indium arsenide (InAs), wherein the first hole QW layer and the second hole QW layer comprise gallium indium antimonide ($Ga_{1-x}In_xSb$), and wherein x is in a range of about 0.2 to about 0.4.

24. The tunable semiconductor laser of claim 19, wherein the second hole QW layer thickness is in a range of about 20 Å to about 40 Å, the first hole QW layer thickness is in a range of about 80% to about 115% of the second hole QW layer thickness, the third electron QW layer thickness is in a range of about 12 Å to about 35 Å, the first electron QW layer thickness exceeds the third electron QW layer thickness by about 10% to about 20%, and the second electron QW layer thickness exceeds the first electron QW layer thickness by about 10% to about 20%.

\* \* \* \* \*